US010291698B2

(12) United States Patent
Hulick et al.

(10) Patent No.: US 10,291,698 B2
(45) Date of Patent: May 14, 2019

(54) ANTENNA STRUCTURES AND ISOLATION CHAMBERS OF A MULTI-RADIO, MULTI-CHANNEL (MRMC) MESH NETWORK DEVICE

(71) Applicant: Amazon Technologies, Inc., Seattle, WA (US)

(72) Inventors: Troy Hulick, Saratoga, CA (US); In Chul Hyun, San Jose, CA (US); Tzung-I Lee, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/650,038

(22) Filed: Jul. 14, 2017

(65) Prior Publication Data

US 2019/0020713 A1 Jan. 17, 2019

(51) Int. Cl.
| | |
|---|---|
| *H01Q 1/00* | (2006.01) |
| *H04L 29/08* | (2006.01) |
| *H01Q 1/24* | (2006.01) |
| *H01Q 1/50* | (2006.01) |
| *H05K 5/04* | (2006.01) |
| *H04W 40/02* | (2009.01) |
| *H01Q 21/29* | (2006.01) |

(52) U.S. Cl.
CPC ......... *H04L 67/1091* (2013.01); *H01Q 1/243* (2013.01); *H01Q 1/50* (2013.01); *H01Q 21/29* (2013.01); *H04W 40/02* (2013.01); *H05K 5/04* (2013.01)

(58) Field of Classification Search
CPC .............................. H04W 88/08; H04W 88/10
See application file for complete search history.

(56) References Cited

U.S. PATENT DOCUMENTS

| | | | |
|---|---|---|---|
| 6,992,641 B1 * | 1/2006 | Sanelli | H01Q 1/246 343/729 |
| 7,450,382 B1 * | 11/2008 | Fischer | H05K 7/20545 361/688 |
| 7,643,794 B2 | 1/2010 | Ofek et al. | |

(Continued)

FOREIGN PATENT DOCUMENTS

| | | |
|---|---|---|
| EP | 1 906 490 A1 | 4/2008 |
| WO | 2015/042968 A1 | 4/2015 |

OTHER PUBLICATIONS

International Search Report and Written Opinion dated Sep. 12, 2018, on application No. PCT/US2018/038808.

*Primary Examiner* — Wen W Huang
(74) *Attorney, Agent, or Firm* — Lowenstein Sandler LLP

(57) ABSTRACT

An electronic device includes a metal housing having a height greater than a width, four sides that form an inner chamber in a center thereof. Four sidewalls extend from a first back wall form a first chamber located at a first of the four sides. Four sidewalls extend from a second back wall form a second chamber located at a second of the four sides. A first antenna is disposed in the first chamber. A second antenna is disposed in the second chamber. A circuit board is disposed within the inner chamber and oriented longitudinally from a bottom of the inner chamber. A first radio is disposed on the circuit board and coupled to the first antenna. A second radio is disposed on the circuit board and coupled to the second antenna, such that the second antenna is electrically isolated from the first antenna.

20 Claims, 20 Drawing Sheets

(56) References Cited

U.S. PATENT DOCUMENTS

| | | | |
|---|---|---|---|
| 7,719,385 B2 | 5/2010 | Choi et al. | |
| 7,893,365 B2* | 2/2011 | Lewison | H05K 5/0021 |
| | | | 174/564 |
| 8,004,844 B2* | 8/2011 | Kim | H05K 7/20163 |
| | | | 361/716 |
| 9,130,279 B1 | 9/2015 | Lee et al. | |
| 9,807,032 B2* | 10/2017 | Merola | H04L 49/10 |
| 9,887,708 B2* | 2/2018 | Hyun | H04B 1/0057 |
| 2007/0247809 A1* | 10/2007 | McClure | G06F 1/20 |
| | | | 361/695 |
| 2008/0238270 A1* | 10/2008 | Wayman | H05K 7/186 |
| | | | 312/199 |
| 2008/0278912 A1* | 11/2008 | Zavadsky | H04Q 1/02 |
| | | | 361/697 |
| 2011/0133996 A1* | 6/2011 | Alapuranen | H01Q 21/28 |
| | | | 343/702 |
| 2011/0134008 A1 | 6/2011 | Schadler et al. | |
| 2012/0282868 A1* | 11/2012 | Hahn | H01Q 3/242 |
| | | | 455/90.3 |
| 2013/0155949 A1* | 6/2013 | Pochop, Jr. | H04B 7/0426 |
| | | | 370/328 |
| 2015/0057047 A1* | 2/2015 | Hendrix | H01Q 1/246 |
| | | | 455/562.1 |
| 2015/0250022 A1* | 9/2015 | Kim | H04W 88/08 |
| | | | 455/561 |
| 2016/0073551 A1 | 3/2016 | Park et al. | |
| 2016/0329641 A1* | 11/2016 | Lee | H01Q 15/14 |
| 2017/0020029 A1* | 1/2017 | Lin | H05K 7/20163 |

* cited by examiner

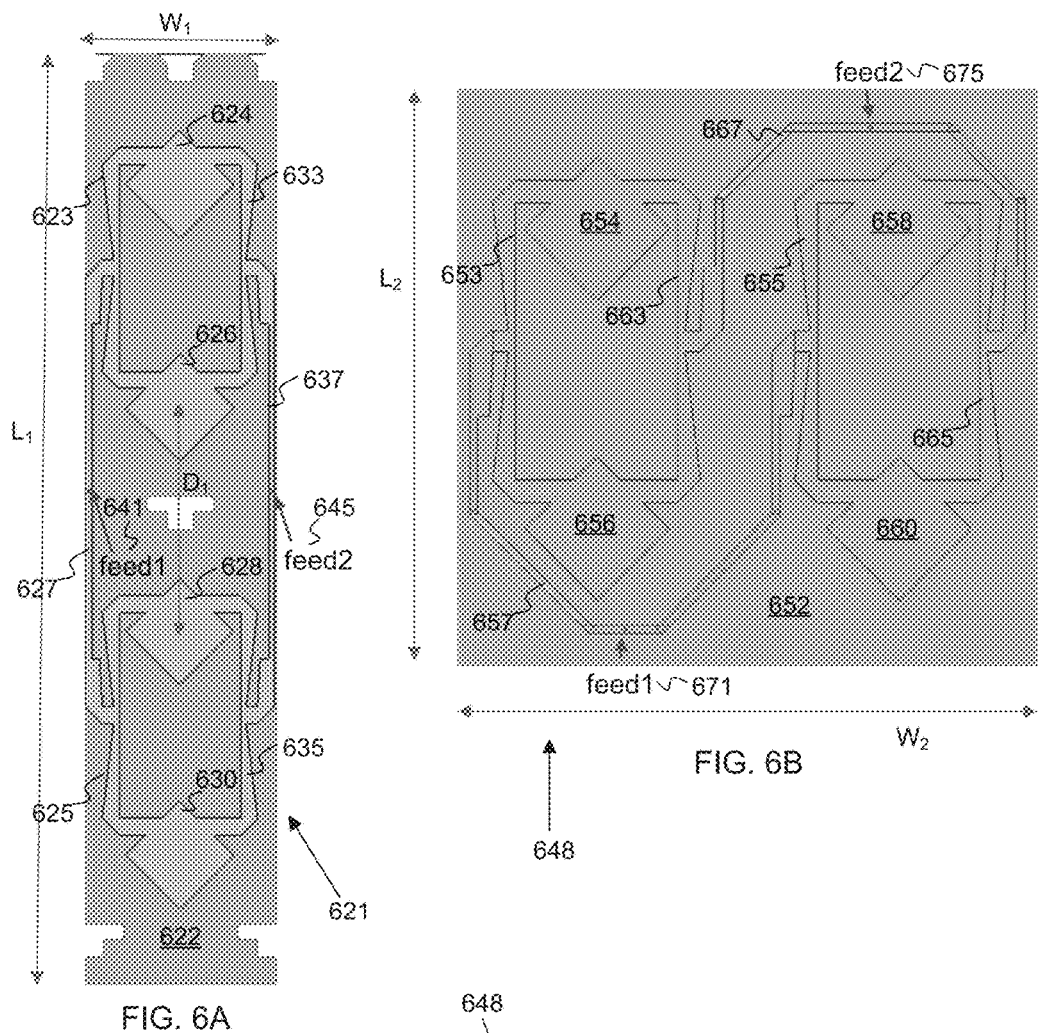
FIG. 6A
FIG. 6B
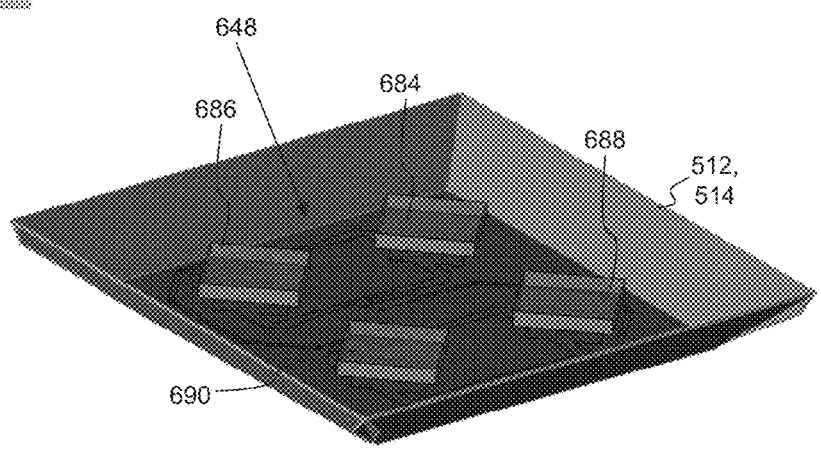
FIG. 6C

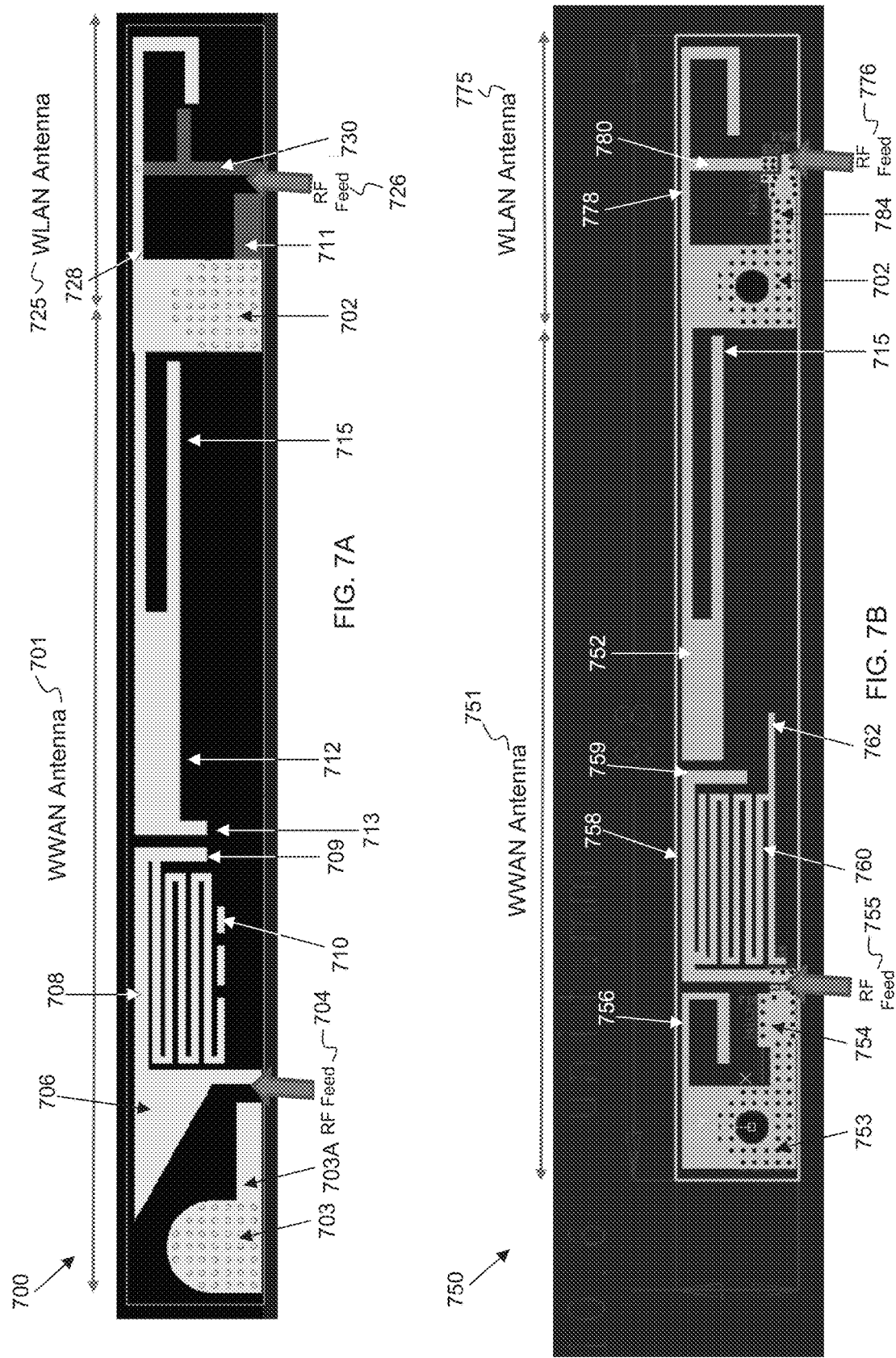

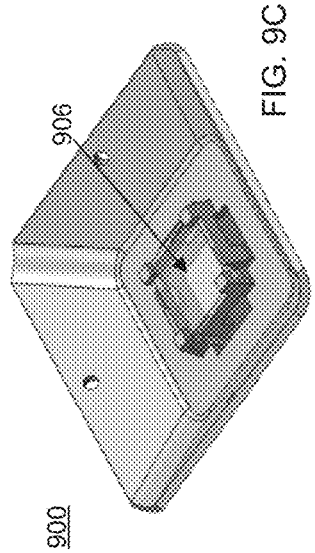
FIG. 9A
FIG. 9B
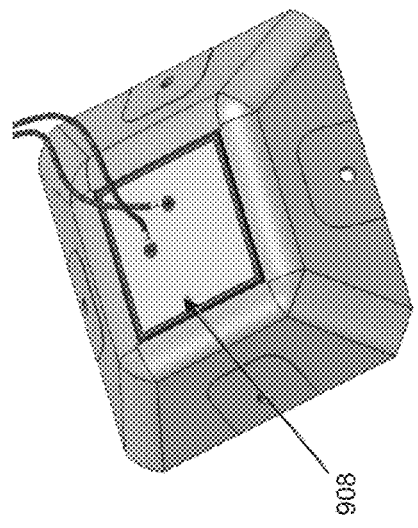
FIG. 9C
FIG. 9D
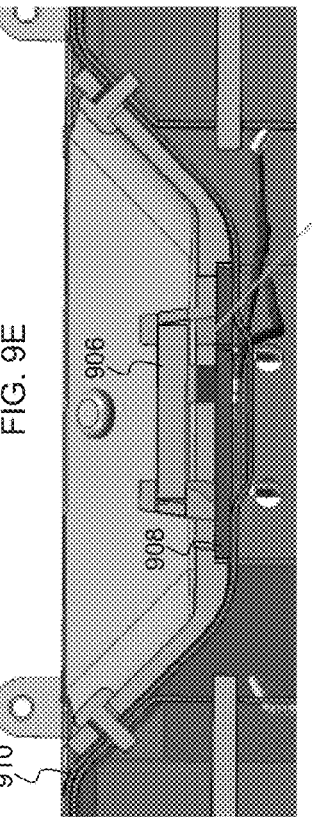
FIG. 9E

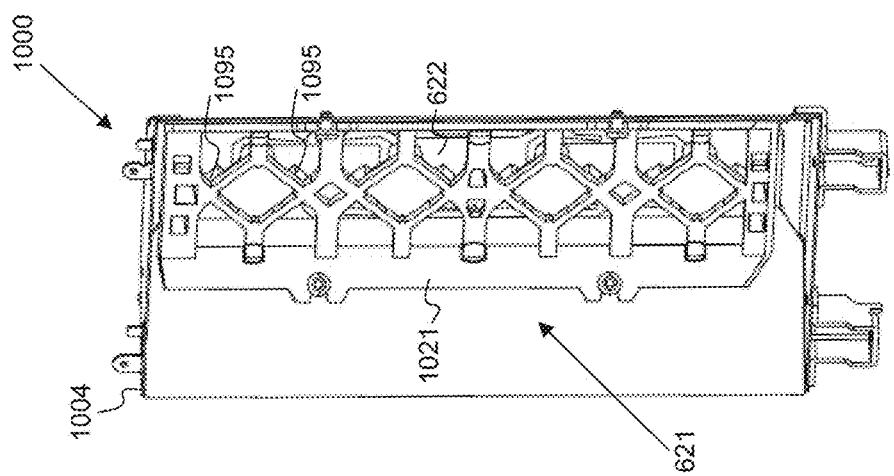
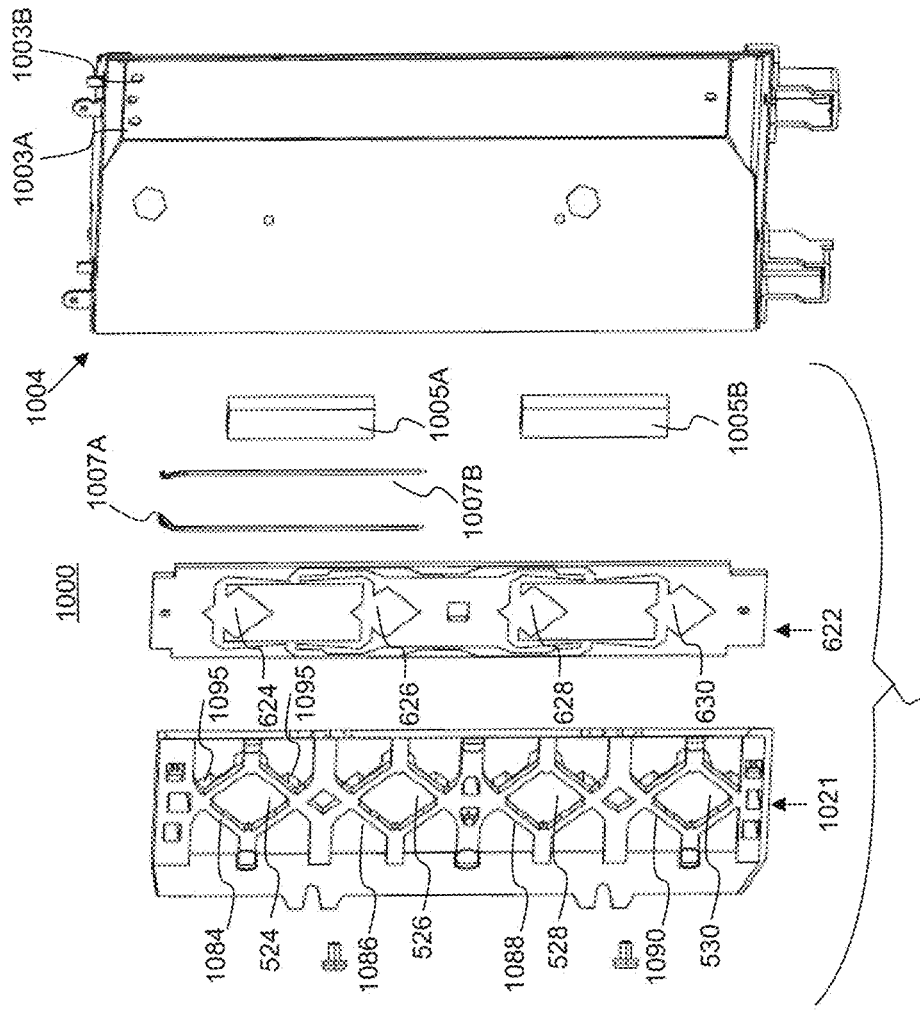
FIG. 10A
FIG. 10B

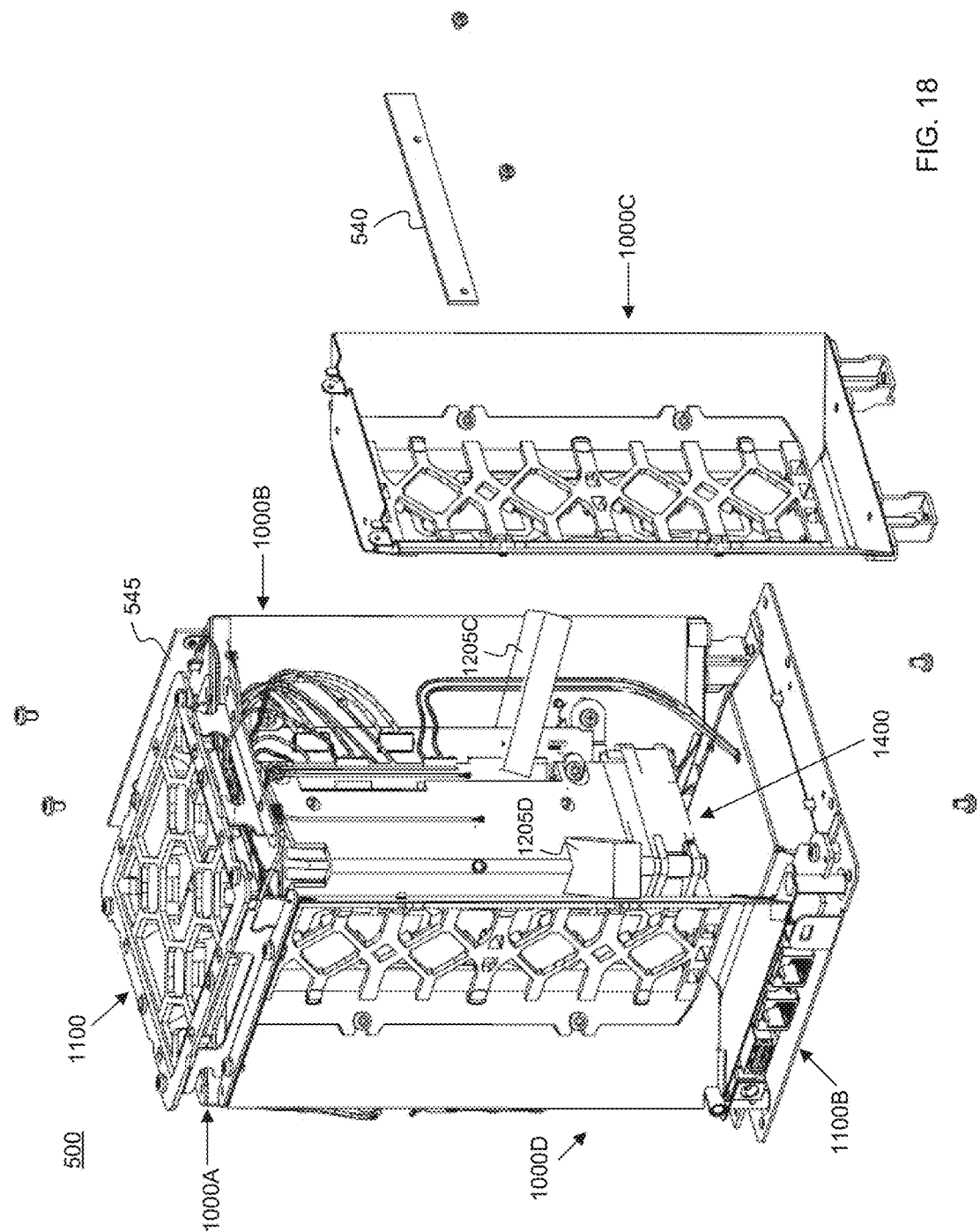

ANTENNA STRUCTURES AND ISOLATION CHAMBERS OF A MULTI-RADIO, MULTI-CHANNEL (MRMC) MESH NETWORK DEVICE

BACKGROUND

A large and growing population of users is enjoying entertainment through the consumption of digital media items, such as music, movies, images, electronic books, and so on. The users employ various electronic devices to consume such media items. Among these electronic devices (referred to herein as user devices) are electronic book readers, cellular telephones, personal digital assistants (PDAs), portable media players, tablet computers, netbooks, laptops and the like. These electronic devices wirelessly communicate with a communications infrastructure to enable the consumption of the digital media items. In order to wirelessly communicate with other devices, these electronic devices include one or more antennas.

BRIEF DESCRIPTION OF DRAWINGS

The present inventions will be understood more fully from the detailed description given below and from the accompanying drawings of various embodiments of the present invention, which, however, should not be taken to limit the present invention to the specific embodiments, but are for explanation and understanding only.

FIG. 6A illustrates a phased array patch antenna on a printed circuit board (PCB) according to one embodiment.

FIG. 6B illustrates a phased array patch antenna on a PCB according to another embodiment.

FIG. 6C illustrates the phased array patch antenna of FIG. 6B within one of a top chamber or a bottom chamber of the MRMC device of FIG. 5A, according to one embodiment.

FIG. 7A illustrates a combination omnidirectional antenna in which a wireless wide area network (WWAN) antenna and a wireless local area network (WLAN) antenna share a common ground on a PCB, according to one embodiment.

FIG. 7B illustrates a combination omnidirectional antenna in which a WWAN antenna and a WLAN antenna share a common ground on a PCB, according to another embodiment.

FIGS. 9A, 9B, 9C, 9D, and 9E illustrate a polymer-based patch antenna within a chamber of the MRMC network device of FIG. 5A according to one embodiment.

FIG. 10A illustrates an exploded view of a side antenna assembly, according to one embodiment.

FIG. 10B illustrates a completely assembled side antenna assembly, according to one embodiment.

FIG. 18 illustrates an almost-complete assembly of the MRMC network device according to one embodiment.

DETAILED DESCRIPTION

Figure 1:
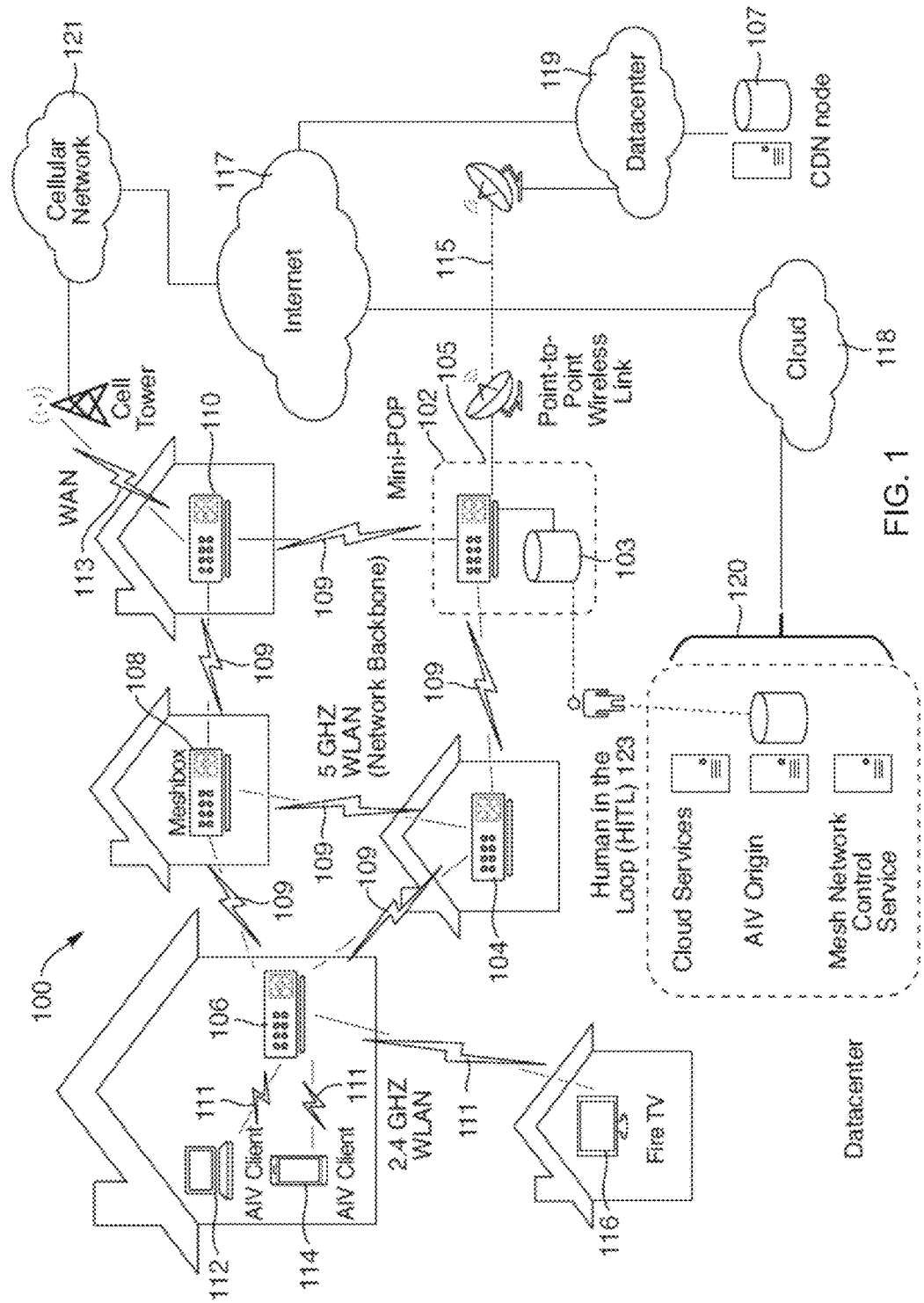
FIG. 1 is a network diagram of network hardware devices organized in a wireless mesh network (WMN) for content distribution to client devices in an environment of limited connectivity to broadband Internet infrastructure according to one embodiment.

A wireless mesh network (WMN) containing multiple mesh network devices, organized in a mesh topology, is described. The mesh network devices in the WMN cooperate in distribution of content files to client consumption devices in an environment of limited connectivity to broadband Internet infrastructure. The embodiments described herein may be implemented where there is the lack, or slow rollout, of suitable broadband Internet infrastructure in developing nations, for example. These mesh networks can be used in the interim before broadband Internet infrastructure becomes widely available in those developing nations.

One system of devices organized in a WMN includes a first network hardware device having at least one of a point-to-point wireless link to access content files over the Internet or a wired connection to access the content files stored on a storage device coupled to the first network hardware device. The network hardware devices are also referred to herein as mesh routers, mesh network devices, mesh nodes, Meshboxes, or Meshbox nodes. Multiple network hardware devices wirelessly are connected through a network backbone formed by multiple peer-to-peer (P2P) wireless connections (i.e., wireless connections between multiple pairs of the network hardware devices). The multiple network devices are wirelessly connected to one or more client consumption devices by node-to-client (N2C) wireless connections. The multiple network devices are wirelessly connected to a mesh network control service (MNCS) device by cellular connections. The cellular connections may have lower bandwidths than the point-to-point wireless link.

A second network hardware device is wirelessly connected to the first network hardware device over a first P2P connection. During operation, the second network hardware device is wirelessly connected to a first client consumption device over a first N2C connection. The second network hardware device receives a first request for a first content file from the first client consumption device over the first N2C connection. The second hardware device sends a second request for the first content file to the first network hardware device over the first P2P connection. The second hardware device receives the first content file from the first network hardware device over the first P2P connection and sends the first content file to the first client consumption device over the first N2C connection. The content file (or generally a content item or object) may be any type of format of digital content, including, for example, electronic texts (e.g., eBooks, electronic magazines, digital newspapers, etc.), digital audio (e.g., music, audible books, etc.), digital video (e.g., movies, television, short clips, etc.), images (e.g., art, photographs, etc.), or multi-media content. The client consumption devices may include any type of content rendering devices such as electronic book readers, portable digital assistants, mobile phones, laptop computers, portable media players, tablet computers, cameras, video cameras, netbooks, notebooks, desktop computers, gaming consoles, DVD players, media centers, and the like.

The embodiments of the mesh network devices may be used to deliver content, such as video, music, literature, or the like, to users who do not have access to broadband Internet connections because the mesh network devices may be deployed in an environment of limited connectivity to broadband Internet infrastructure. In some of the embodiments described herein, the mesh network architecture does not include "gateway" nodes that are capable of forwarding broadband mesh traffic to the Internet. The mesh network architecture may include a limited number of point-of-presence (POP) nodes that do have access to the Internet, but the majority of mesh network devices is capable of forwarding broadband mesh traffic between the mesh network devices for delivering content to client consumption devices that would otherwise not have broadband connections to the Internet. Alternatively, instead of a POP node having access to broadband Internet infrastructure, the POP node is coupled to storage devices that store the available content for the WMN. The WMN may be self-contained in the sense that content lives in, travels through, and is consumed by nodes in the mesh network. In some embodiments, the mesh network architecture includes a large number of mesh nodes, called Meshbox nodes. From a hardware perspective, the Meshbox node functions much like an enterprise-class router with the added capability of supporting P2P connections to form a network backbone of the WMN. From a software perspective, the Meshbox nodes provide much of the capability of a standard content distribution network (CDN), but in a localized manner. The WMN can be deployed in a geographical area in which broadband Internet is limited. The WMN can scale to support a geographic area based on the number of mesh network devices, and the corresponding distances for successful communications over WLAN channels by those mesh network devices.

Although various embodiments herein are directed to content delivery, such as for the Amazon Instant Video (AIV) service, the WMNs, and corresponding mesh network devices, can be used as a platform suitable for delivering high bandwidth content in any application where low latency is not critical or access patterns are predictable. The embodiments described herein are compatible with existing content delivery technologies, and may leverage architectural solutions, such as CDN surfaces like the Amazon AWS CloudFront service. Amazon CloudFront CDN is a global CDN service that integrates with other Amazon Web services products to distribute content to end users with low latency and high data transfer speeds. The embodiments described herein can be an extension to this global CDN, but in environments where there is limited broadband Internet infrastructure. The embodiments described herein may provide users in these environments with a content delivery experience equivalent to what the users would receive on a traditional broadband Internet connection. The embodiments described herein may be used to optimize deployment for traffic types (e.g., streaming video) that are increasingly becoming a significant percentage of broadband traffic and taxing existing infrastructure in a way that is not sustainable.

Figure 2:
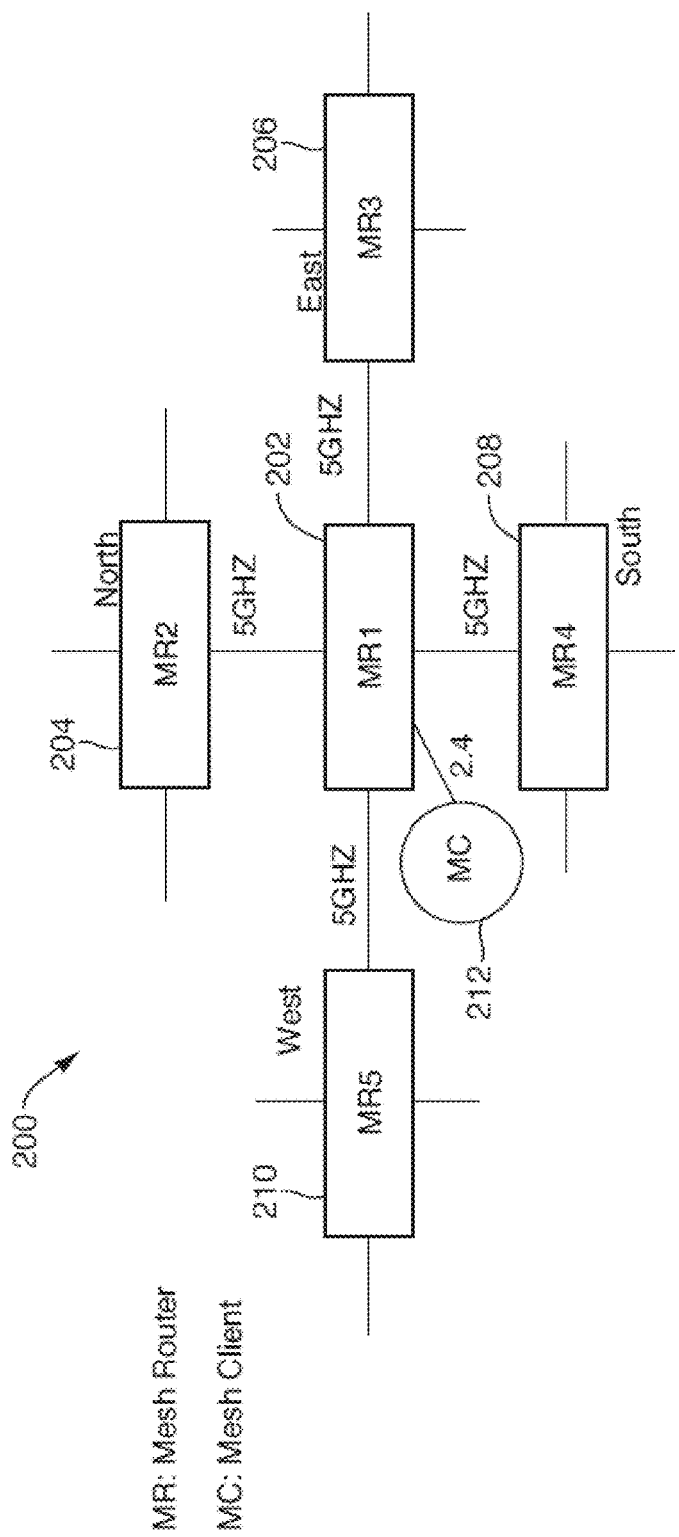
FIG. 2 is a block diagram of a network hardware device with five radios operating concurrently in a WMN according to one embodiment.
Figure 3:
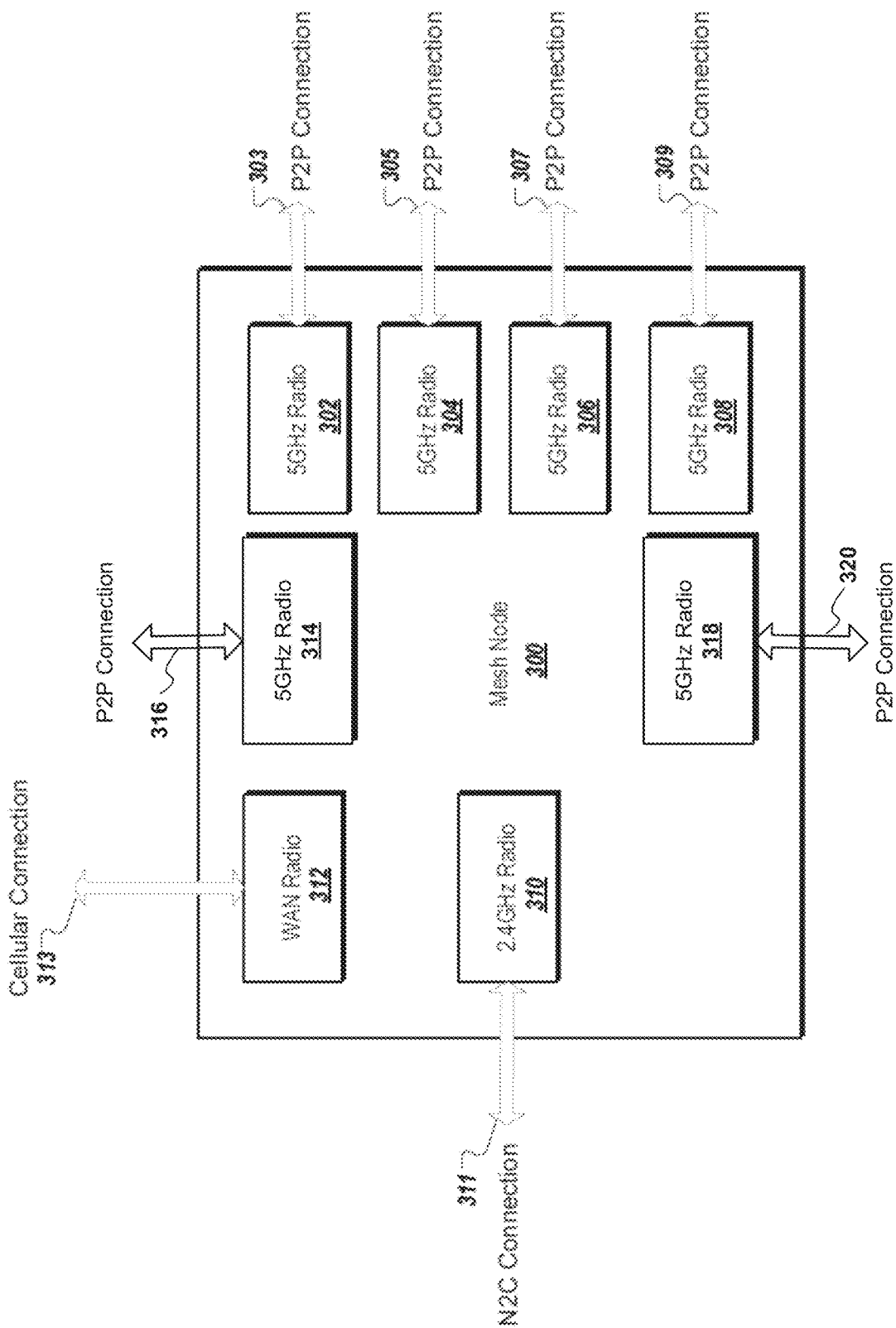
FIG. 3 is a block diagram of a mesh node with multiple radios according to one embodiment.

FIGS. 1-3 are generally directed to network hardware devices, organized in a wireless mesh network, for content distribution to client consumption devices in environments of limited connectivity to broadband internet infrastructure. FIGS. 5-19 are generally directed to embodiments of antenna structures and isolations chambers of a multi-radio, multi-channel (MRMC) mesh network device.

FIG. 1 is a network diagram of network hardware devices 102-110, organized in a wireless mesh network (WMN) 100, for content distribution to client devices in an environment of limited connectivity to broadband Internet infrastructure according to one embodiment. The WMN 100 includes multiple network hardware devices 102-110 that connect together to transfer digital content through the WMN 100 to be delivered to one or more client consumption devices connected to the WMN 100. In the depicted embodiment, the WMN 100 includes a miniature point-of-presence (mini-POP) device 102 (also referred to as mini-POP device), having at least one of a first wired connection to an attached storage device 103 or a point-to-point wireless connection 105 to a CDN device 107 (server of a CDN or a CDN node) of an Internet Service Provider (ISP). The CDN device 107 may be a POP device (also referred to as a POP device), an edge server, a content server device or another device of the CDN. The mini-POP device 102 may be similar to POP devices of a CDN in operation. However, the mini-POP device 102 is called a miniature to differentiate it from a POP device of a CDN given the nature of the mini-POP device 102 being a single ingress point to the WMN 100; whereas, the POP device of a CDN may be one of many in the CDN.

The point-to-point wireless connection 105 may be established over a point-to-point wireless link 115 between the mini-POP device 102 and the CDN device 107. Alternatively, the point-to-point wireless connection 105 may be established over a directional microwave link between the mini-POP device 102 and the CDN device 107. In other embodiments, the mini-POP device 102 is a single ingress node of the WMN 100 for the content files stored in the WMN 100. Meaning the mini-POP 102 may be the only node in the WMN 100 having access to the attached storage or a communication channel to retrieve content files stored outside of the WMN 100. In other embodiments, multiple mini-POP devices may be deployed in the WMN 100, but the number of mini-POP devices should be much smaller than a total number of network hardware devices in the WMN 100. Although a point-to-point wireless connection can be used, in other embodiments, other communication channels may be used. For example, a microwave communication channel may be used to exchange data. Other long distance communication channels may be used, such as a fiber-optic link, satellite link, cellular link, or the like. The network hardware devices of the WMN 100 may not have direct access to the mini-POP device 102, but can use one or more intervening nodes to get content from the mini-POP device. The intervening nodes may also cache content that can be accessed by other nodes. The network hardware devices may also determine a shortest possible route between the requesting node and a node where a particular content file is stored.

The CDN device 107 may be located at a datacenter 119 and may be connected to the Internet 117. The CDN device 107 may be one of many devices in the global CDN and may implement the Amazon CloudFront technology. The CDN device 107 and the datacenter 119 may be co-located with the equipment of the point-to-point wireless link 155. The point-to-point wireless connection 105 can be considered a broadband connection for the WMN 100. In some cases, the mini-POP device 102 does not have an Internet connection via the point-to-point wireless connection 105 and the content is stored only in the attached storage device 103 for a self-contained WMN 100.

The WMN 100 also includes multiple mesh nodes 104-110 (also referred to herein as meshbox nodes and network hardware devices). The mesh nodes 104-110 may establish multiple P2P wireless connections 109 between mesh nodes 104-110 to form a network backbone. It should be noted that only some of the possible P2P wireless connections 109 are shown between the mesh nodes 104-110 in FIG. 1. In particular, a first mesh node 104 is wirelessly coupled to the mini-POP device 102 via a first P2P wireless connection 109, as well as being wirelessly coupled to a second mesh node 106 via a second P2P wireless connection 109 and a third mesh node 108 via a third P2P wireless connection. The mesh nodes 104-110 (and the mini-POP device 102) are MRMC mesh network devices. As described herein, the mesh nodes 104-110 do not necessarily have reliable access to the CDN device 107. The mesh nodes 104-110 (and the mini-POP device 102) wirelessly communicate with other nodes via the network backbone via a first set of WLAN channels reserved for inter-node communications. The mesh nodes 102-110 communicate data with one another via the first set of WLAN channels at a first frequency of approximately 5 GHz (e.g., 5 GHz band of the Wi-Fi® network technologies).

Each of the mesh nodes 104-110 (and the mini-POP device 102) also includes multiple node-to-client (N2C) wireless connections 111 to wirelessly communicate with one or more client consumption devices via a second set of WLAN channels reserved for serving content files to client consumption devices connected to the WMN 100. In particular, the second mesh node 106 is wirelessly coupled to a first client consumption device 112 (AIV client) via a first N2C wireless connection 111, a second client consumption device 114 (AIV client) via a second N2C wireless connection 111, and a third client consumption device 116 (e.g., the Fire TV device) via a third N2C wireless connection 111. The second node 106 wirelessly communicates with the client consumption devices via the second set of WLAN channels at a second frequency of approximately 2.4 GHz (e.g., 2.4 GHz band of the Wi-Fi® network technologies).

Each of the mesh nodes 104-110 (and the mini-POP device 102) also includes a cellular connection 113 to wirelessly communicate control data between the respective node and a second device 118 hosting a mesh network control service described below. The cellular connection 113 may be a low bandwidth, high availability connection to the Internet 117 provided by a cellular network. The cellular connection 113 may have a lower bandwidth than the point-to-point wireless connection 105. There may be many uses for this connection including, health monitoring of the mesh nodes, collecting network statistics of the mesh nodes, configuring the mesh nodes, and providing client access to other services. In particular, the mesh node 110 connects to a cellular network 121 via the cellular connection 113. The cellular network 121 is coupled to the second device 118 via the Internet 117. The second device 118 may be one of a collection of devices organized as a cloud computing system that hosts one or more services 120. The services 120 may include cloud services to control setup of the mesh nodes, the content delivery service (e.g., AIV origin), as well as other cloud services. The mesh network control service can be one or more cloud services. The cloud services can include a metric collector service, a health and status service, a link selection service, a channel selection service, a content request aggregation service, or the like. There may be APIs for each of these services. Although this cellular connection may provide access to the Internet 117, the amount of traffic that goes through this connection should be minimized, since it may be a relatively costly link. This cellular connection 113 may be used to communicate various control data to configure the mesh network for content delivery. In addition, the cellular connection 113 can provide a global view of the state of the WMN 100 remotely. Also, the cellular connection 113 may aid in the debugging and optimization of the WMN 100. In other embodiments, other low bandwidth services may also be offered through this link (e.g. email, shopping on Amazon.com, or the like).

Although only four mesh nodes 104-110 are illustrated in FIG. 1, the WMN 100 can use many mesh nodes, wirelessly connected together in a mesh network, to move content through the WMN 100. The 5 GHz WLAN channels are reserved for inter-node communications (i.e., the network backbone). Theoretically, there is no limit to the number of links a given Meshbox node can have to its neighbor nodes. However, practical considerations, including memory, routing complexity, physical radio resources, and link bandwidth requirements, may place a limit on the number of links maintained to neighboring mesh nodes. Meshbox nodes may function as traditional access points (APs) for devices running AIV client software. The 2.4 GHz WLAN channels are reserved for serving client consumption devices. The 2.4 GHz band may be chosen for serving clients because there is a wider device adoption and support for this band. Additionally, the bandwidth requirements for serving client consumption devices will be lower than that of the network backbone. The number of clients that each Meshbox node can support depends on a number of factors including memory, bandwidth requirements of the client, incoming bandwidth that the Meshbox node can support, and the like. For example, the Meshbox nodes provide coverage to users who subscribe to the content delivery service and consume that service through an AIV client on the client consumption devices (e.g., a mobile phone, a set top box, a tablet, or the like). It should be noted that there is a 1-to-many relationship between Meshbox nodes and households (not just between nodes and clients). This means the service can be provided without necessarily requiring a customer to have a Meshbox node located in their house, as illustrated in FIG. 1. As illustrated, the second mesh node 106 services two client consumption devices 112, 114 (e.g., AIV clients) located in a first house, as well as a third client consumption device 116 (e.g., the Fire TV client) located in a second house. The Meshbox nodes can be located in various structures, and there can be multiple Meshbox nodes in a single structure.

The WMN 100 may be used to address two main challenges: moving high bandwidth content to users and storing that content in the network itself. The first challenge may be addressed in hardware through the radio links between mesh nodes and the radio links between mesh nodes and client consumption devices, and in software by the routing protocols used to decide where to push traffic and link and channel management used to configure the WMN 100. The second challenge may be addressed by borrowing from the existing content distribution strategy employed by the content delivery services (e.g., AIV) using caches of content close to the user. The architecture to support content caching is known as a CDN. An example CDN implementation is the AWS CloudFront service. The AWS CloudFront service may include several point-of-presence (POP) racks that are co-located in datacenters that see a lot of customer traffic (for example an ISP), such as illustrated in datacenter 119 in FIG. 1. A POP rack has server devices to handle incoming client requests and storage devices to cache content for these requests. If the content is present in the POP rack, the content is served to the client consumption device from there. If it is not stored in the POP rack, a cache miss is triggered and the content is fetched from the next level of cache, culminating in the "origin," which is a central repository for all available content. In contrast, as illustrated in FIG. 1, the WMN 100 includes the mini-POP device 102 that is designed to handle smaller amounts of traffic than a typical POP rack. Architecturally, the mini-POP device 102 may be designed as a Meshbox node with storage attached (e.g. external hard disk). The mini-POP device 102 may function identically to a POP device with the exception of how cache misses are handled. Because of the lack of broadband Internet infrastructure, the mini-POP device 102 has no traditional Internet connection to the next level of cache. The following describes two different solutions for providing the next level of cache to the mini-POP device 102.

In one embodiment, the mini-POP device 102 is coupled to an existing CDN device 107 via a directional microwave link or other point-to-point wireless link 115. A directional microwave link is a fairly easy way to get a relatively high bandwidth connection between two points. However, line of sight is required which might not be possible with terrain or building constraints. In another embodiment, the mini-POP device 102 can operate with a human in the loop (HITL) to update the cache contents. HITL implies that a person will be tasked with manually swapping out the hard drives with a hard drives with the updated content or adding the content to the hard drive. This solution may be a relatively high bandwidth but extremely high latency solution and may only be suitable if the use cases allow longer times (e.g., hours) to service a cache miss.

The WMN 100 may be considered a multi-radio multi-channel (MRMC) mesh network. MRMC mesh networks are an evolution of traditional single radio WMNs and a leading contender for combatting the radio resource contention that has plagued single radio WMNs and prevents them from scaling to any significant size. The WMN 100 has multiple devices, each with multi-radio multi-channel (MRMC) radios. The multiple radios for P2P connections and N2C connections of the mesh network devices allow the WMN 100 to be scaled to a significant size, such as 10,000 mesh nodes. For example, unlike the conventional solutions that could not effectively scale, the embodiments described herein can be very large scale, such as a 100×100 grid of nodes with 12-15 hops between nodes to serve content to client consumption devices. The paths to fetch content files may not be a linear path within the mesh network.

The WMN 100 can provide adequate bandwidth, especially node-to-node bandwidth. For video, content delivery services recommend a minimum of 900 Kbps for standard definition content and 3.5 Mbps for high definition content. The WMN 100 can provide higher bandwidths than those recommended for standard definition and high definition content. Prior solutions found that for a 10,000-node mesh network covering one square kilometer, the upper bound on inter-node traffic is 221 kbps. The following can impact bandwidth: forwarding traffic, wireless contention (MAC/PHY), and routing protocols.

In some embodiments, the WMN 100 can be self-contained as described herein. The WMN 100 may be self-contained in the sense that content resides in, travels through, and is consumed by nodes in the mesh network without requiring the content to be fetched outside of the WMN 100. In other embodiments, the WMN 100 can have mechanisms for content injection and distribution. One or more of the services 120 can manage the setup of content injection and distribution. These services (e.g., labeled mesh network control service) can be hosted by as cloud services, such as on one or more content delivery service devices. These mechanisms can be used for injecting content into the network as new content is created or as user viewing preferences change. Although these injection mechanisms may not inject the content in real time, the content can be injected into the WMN 100 via the point-to-point wireless connection 105 or the HITL process at the mini-POP device 102. Availability and impact on cost in terms of storage may be relevant factors in determining which content is to be injected into the WMN 100 and which content is to remain in the WMN 100. A challenge for traditional mesh network architectures is that this content is high bandwidth (in the case of video) and so the gateway nodes that connect the mesh to the larger Internet must be also be high bandwidth. However, taking a closer look at the use case reveals that this content, although high bandwidth, does not need to be low latency. The embodiments of the WMN 100 described herein can provide distribution of content that is high bandwidth, but in a manner that does not need low latency.

In some embodiments, prior to consumption by a node having an AIV client itself or being wirelessly connected to an AIV client executing on a client consumption device, the content may be pulled close to that node. This may involve either predicting when content will be consumed to proactively move it closer (referred to as caching) or always having it close (referred to as replication). Content replication is conceptually straightforward, but may impact storage requirements and requires apriori knowledge on the popularity of given titles.

Another consideration is where and how to store content in the WMN 100. The WMN 100 can provide some fault tolerance so that a single mesh node becoming unavailable for failure or reboot has minimal impact on availability of content to other users. This means that a single mesh node is not the sole provider of a piece of content. The WMN 100 can use reliability and availability mechanisms and techniques to determine where and how to store content in the WMN 100.

The WMN 100 can be deployed in an unpredictable environment. Radio conditions may not be constant and sudden losses of power may occur. The WMN 100 is designed to be robust to temporary failures of individual nodes. The WMN 100 can be designed to identify those failures and adapt to these failures once identified. Additionally, the WMN 100 can include mechanisms to provide secure storage of the content that resides within the WMN 100 and prevent unauthorized access to that content.

The cloud services 120 of the WMN 100 can include mechanisms to deal with mesh nodes that become unavailable, adding, removing, or modifying existing mesh nodes in the WMN 100. The cloud services 120 may also include mechanisms for remote health and management. For example, there may be a remote health interface, a management interface, or both to access the mesh nodes for this purpose. The cloud services 120 can also include mechanisms for securing the WMN 100 and the content that resides in the WMN 100. For example, the cloud services 120 can control device access, DRM, and node authentication.

FIG. 2 is a block diagram of a network hardware device 202 with five radios operating concurrently in a wireless mesh network 200 according to one embodiment. The wireless mesh network 200 includes multiple network hardware devices 202-210. The network hardware device 202 may be considered a mesh router that includes four 5 GHz radios for the network backbone for multiple connections with other mesh routers, i.e., network hardware devices 204-210. For example, the network hardware device 204 may be located to the north of the network hardware device 202 and connected over a first 5 GHz connection. The network hardware device 206 may be located to the east of the network hardware device 202 and connected over a second 5 GHz connection. The network hardware device 208 may be located to the south of the network hardware device 202 and connected over a third 5 GHz connection. The network hardware device 210 may be located to the west of the network hardware device 202 and connected over a fourth 5 GHz connection. In other embodiments, additional network hardware devices can be connected to other 5 GHz connections of the network hardware device 202. It should also be noted that the network hardware devices 204-210 may also connect to other network hardware devices using its respective radios. It should also be noted that the locations of the network hardware devices 20-210 can be in other locations that north, south, east, and west. For example, the network hardware devices can be located above or below the mesh network device 202, such as on another floor of a building or house.

The network hardware device 202 also includes at least one 2.4 GHz connection to serve client consumption devices, such as the client consumption device 212 connected to the network hardware device 202. The network hardware device 202 may operate as a mesh router that has five radios operating concurrently or simultaneously to transfer mesh network traffic, as well as service connected client consumption devices. This may require that the 5GLL and 5GLH to be operating simultaneously and the 5GHL and 5GHH to be operating simultaneously, as described in more detail below. It should be noted that although the depicted embodiment illustrates and describes five mesh nodes, in other embodiments, more than five mesh nodes may be used in the WMN. It should be noted that FIG. 2 is a simplification of neighboring mesh network devices for a given mesh network device. The deployment of forty or more mesh network devices may actually be located at various directions than simply north, south, east, and west as illustrated in FIG. 2. Also, it should be noted that here are a limited number of communication channels available to communicate with neighboring mesh nodes in the particular wireless technology, such as the Wi-Fi® 5 GHz band. The embodiments of the mesh network devices, such as the directional antennas, can help with isolation between neighboring antennas that cannot be separated physically given the limited size the mesh network device.

FIG. 3 is a block diagram of a mesh node 300 with multiple radios according to one embodiment. The mesh node 300 includes a first 5 GHz radio 302, a second 5 GHz radio 304, a third 5 GHz radio 306, a fourth 5 GHz radio 308, a fifth 5 GHz radio 314, a sixth 5 GHz radio 316, a 2.4 GHz radio 310, and a cellular radio 312. The first 5 GHz radio 302 creates a first P2P wireless connection 303 between the mesh node 300 and another mesh node (not illustrated) in a WMN. The second 5 GHz radio 304 creates a second P2P wireless connection 305 between the mesh node 300 and another mesh node (not illustrated) in the WMN. The third 5 GHz radio 306 creates a third P2P wireless connection 307 between the mesh node 300 and another mesh node (not illustrated) in the WMN. The fourth 5 GHz radio 308 creates a fourth P2P wireless connection 309 between the mesh node 300 and another mesh node (not illustrated) in the WMN. The fifth 5 GHz radio 316 creates a fourth P2P wireless connection 316 between the mesh node 300 and another mesh node (not illustrated) in the WMN. The sixth 5 GHz radio 318 creates a fourth P2P wireless connection 320 between the mesh node 300 and another mesh node (not illustrated) in the WMN. In some embodiments, the mesh node includes four 5 GHz radios, in which case the fifth 5 GHz radio 314 and the sixth 5 GHz radio 318 may be excluded.

The 2.4 GHz radio 310 creates a N2C wireless connection 311 between the mesh node 300 and a client consumption device (not illustrated) in the WMN. The cellular radio 312 creates a cellular connection between the mesh node 300 and a device in a cellular network (not illustrated). In other embodiments, more than one 2.4 GHz radios may be used for more N2C wireless connections. Alternatively, different number of 5 GHz radios may be used for more or less P2P wireless connections with other mesh nodes. In other embodiments, multiple cellular radios may be used to create multiple cellular connections.

In another embodiment, a system of devices can be organized in a WMN. The system may include a single ingress node for ingress of content files into the wireless mesh network. In one embodiment, the single ingress node is a mini-POP device that has attached storage device(s). The single ingress node may optionally include a point-to-point wireless connection, such as a microwave communication channel to a node of the CDN. The single ingress node may include a point-to-point wireless link to the Internet (e.g., a server device of the CDN) to access content files over the Internet. Alternatively to, or in addition to the point-to-point wireless link, the single ingress node may include a wired connection to a storage device to access the content files stored on the storage device. Multiple network hardware devices are wirelessly connected through a network backbone formed by multiple P2P wireless connections. These P2P wireless connections are wireless connections between different pairs of the network hardware devices. The P2P wireless connections may be a first set of WLAN connections that operate at a first frequency of approximately 5.0 GHz. The multiple network hardware devices may be wirelessly connected to one or more client consumption devices by one or more N2C wireless connections. Also, the multiple network hardware devices may be wirelessly connected to a mesh network control services (MNCS) device by cellular connections. Each network hardware device includes a cellular connection to a MNCS service hosted by a cloud computing system. The cellular connections may have lower bandwidths than the point-to-point wireless link.

The system includes a first network hardware device wirelessly connected to a first client consumption device by a first node-to-client (N2C) wireless connection and a second network hardware device wirelessly connected to the single ingress node. The first network hardware device can wirelessly connect to a first client consumption device over a first N2C connection. The N2C wireless connection may be one of a second set of one or more WLAN connections that operate at a second frequency of approximately 2.4 GHz. During operation, the first network hardware device may receive a first request for a first content file from the first client consumption device over the first N2C connection. The first network device sends a second request for the first content file to the second network hardware device through the network backbone via a first set of zero or more intervening network hardware devices between the first network hardware device and the second network hardware device. The first network device receives the first content file from the first network hardware device through the network backbone via the first set of zero or more intervening network hardware devices and sends the first content file to the first client consumption device over the first N2C connection. In a further embodiment, the first network hardware device includes another radio to wirelessly connect to a MNCS device by a cellular connection to exchange control data.

In a further embodiment, the first network hardware device is further to receive a third request for a second content file from a second client consumption device connected to the first network hardware device over a second N2C connection between the first network hardware device and the second client consumption device. The first network hardware device sends a fourth request for the second content file stored at a third network hardware device through the network backbone via a second set of zero or more intervening network hardware devices between the first network hardware device and the third network hardware device. The first network hardware device receives the second content file from the third network hardware device through the network backbone via the second set of zero or more intervening network hardware devices. The first network hardware device sends the second content file to the second client consumption device over the second N2C connection.

In one embodiment, the zero or more intervening network hardware devices of the first set are not the same as the zero or more intervening network hardware devices of the second set. In some embodiments, a path between the first network hardware device and the second network hardware device could include zero or more hops of intervening network hardware devices. In some cases, the path may include up to 12-15 hops within a mesh network of 100×100 network hardware devices deployed in the WMN. In some embodiments, a number of network hardware devices in the WMN is greater than fifty. The WMN may include hundreds, thousands, and even tens of thousands of network hardware devices.

In a further embodiment, the first network hardware device receive the fourth request for the second content file from a fourth network hardware device through the network backbone via a third set of zero or more intervening network hardware devices between the first network hardware device and the fourth network hardware device. The first network hardware device sends the second content file to the fourth network hardware device through the network backbone via the third set of zero or more intervening network hardware devices.

In some embodiments, the first network hardware device determines whether the first content file is stored in memory of the first network hardware device. The memory of the first network hardware device may be volatile memory, non-volatile memory, or a combination of both. When the first content file is not stored in the memory or the storage of the first network hardware device, the first network hardware device generates and sends the second request to a first network hardware device of the first set. Intervening network hardware devices can make similar determinations to locate the first content file in the WMN. In the event that the first content file is not stored in the second network hardware device or any intervening nodes, the second network hardware device can request the first content file from the mini-POP device, as described herein. When the mini-POP device does not store the first content file, the mini-POP can take action to obtain the first content file, such as requesting the first content file from a CDN over a point-to-point link. Alternatively, the human in the loop process can be initiated as described herein.

In a further embodiment, the second network hardware device receives the second request for the first content file and retrieves the first content file from the single ingress node when the first content file is not previously stored at the second network hardware device. The second network hardware device sends a response to the second request with the first content file retrieved from the single ingress node. The second network hardware device may store a copy of the first content file in memory of the second network hardware device for a time period.

In another embodiment, the single ingress node receives a request for a content file from one of the multiple network hardware devices over a P2P wireless connection. The request originates from a requesting consumption device. It should be noted that a video client can be installed on the client consumption device, on the network hardware device, or both. The single ingress node determines whether the content file is stored in a storage device coupled to the single ingress node. The single ingress node generates and sends a first notification to the requesting one of the network hardware devices over the P2P wireless connection when the content file is not stored in the storage device. The first notification includes information to indicate an estimated delay for the content file to be available for delivery. The single ingress node generates and sends a second notification to an operator of the first network hardware device. The second notification includes information to indicate that the content file has been requested by the requesting client consumption device. In this embodiment, the notifications can be pushed to the appropriate recipients. In another embodiment, an operator can request which content files had been requested in the WMN and not serviced. This can initiate the ingress of the content file into the WMN, even if with a longer delay.

In some embodiments, the mini-POP device is coupled to a storage device to store the content files as original content files for the wireless mesh network. A point-to-point wireless link may be established between the mini-POP device and a CDN device. In another embodiment, the mini-POP device is coupled to a node of a content delivery network (CDN) via a microwave communication channel.

In a further embodiment, the second network hardware device can wirelessly connect to a third network hardware device over a second P2P connection. During operation, the third network hardware device may receive a third request for a second content file from a second client consumption device over a second N2C connection between the third network hardware device and the second client consumption device. The third network hardware device sends a fourth request for the second content file to the second network hardware device over the second P2P connection. The third network hardware device receives the second content file from the second network hardware device over the second P2P connection and sends the second content file to the second client consumption device over the second N2C connection.

In another embodiment, the first network hardware device receives the fourth request for the second content file from the third network hardware device. The second network hardware device determines whether the second content file is stored in memory of the second network hardware device. The second network hardware device sends a fifth request to the first network hardware device over the first P2P connection and receive the second content file over the first P2P connection from the first network hardware device when the second content file is not stored in the memory of the second network hardware device. The second network hardware device sends the second content file to the third network hardware device over the second P2P connection.

In another embodiment, the second network hardware device may wirelessly connect to a third network hardware device over a second P2P connection. During operation, the third network hardware device may receive a third request for the first content file from a second client consumption device over a second N2C connection between the third network hardware device and the second client consumption device. The third network hardware device sends a fourth request for the first content file to the second network hardware device over the second P2P connection. The third network hardware device receives the first content file from the first network hardware device over the second P2P connection and sends the first content file to the second client consumption device over the second N2C connection.

In another embodiment, the first network hardware device receives a request for a content file from one of the network hardware devices over one of the P2P wireless connections. The request is from a requesting client consumption device connected to one of the multiple network hardware devices. The first network hardware device determines whether the content file is stored in the storage device. The first network hardware device generates and sends a first notification to the one of the network hardware devices over the one of the P2P wireless connections when the content file is not stored in the storage device. The first notification may include information to indicate an estimated delay for the content file to be available for delivery. The first network hardware device generates and sends a second notification to an operator of the first network hardware device. The second notification may include information to indicate that the content file has been requested by the requesting client consumption device.

In a further embodiment, the P2P wireless connections are WLAN connections that operate in a first frequency range and the N2C connections are WLAN connections that operate in a second frequency range. In another embodiment, the P2P wireless connections operate at a first frequency of approximately 5.0 GHz and the N2C connections operate at a second frequency of approximately 2.4 GHz.

In some embodiments, at least one of the network hardware devices is a mini-POP) node and a point-to-point wireless link is established between the mini-POP device and a POP device of an ISP. In one embodiment, the point-to-point wireless link is a microwave link (e.g., directional microwave link) between the mini-POP device and the CDN device. In another embodiment, the mini-POP device stores an index of the content files store in attached storage devices.

In some embodiments, a mesh network architecture includes multiple mesh nodes organized in a self-contained mesh network. The self-contained mesh network may be self-contained in the sense that content resides in, travels through, and is consumed by nodes in the mesh network without requiring the content to be fetched outside of the mesh network. Each of the mesh nodes includes a first radio for inter-node communications with the other nodes on multiple P2P channels, a second radio for communications with client consumption devices on N2C channels. The mesh network architecture also includes a mini-POP device including a radio for inter-connection communications with at least one of the mesh nodes on a P2P channel. The mesh network architecture also includes a storage device coupled to the mini-POP, the storage device to store content files for distribution to a requesting client consumption device. The mini-POP device may be the only ingress point for content files for the self-contained mesh network. The storage devices of the mini-POP device may be internal drives, external drives, or both. During operation, a first node of the mesh nodes includes a first radio to wirelessly connect to a requesting client consumption device via a first N2C channel to receive a first request for a content file directly from the requesting client consumption device via a first N2C channel between the first node and the requesting client consumption device 1. A second radio of the first node sends a second request for the content file to a second node via a first set of zero or more intervening nodes between the first node and the second node to locate the content file within the self-contained mesh network. The second radio receives the content file from the second node in response to the request. The first radio sends the content file to the requesting client consumption device via the first N2C channel. The first node determines a location of the content file within the self-contained mesh network and sends a second request for the content file via a second P2P channel to at least one of the mini-POP or a second node, the second request to initiate delivery of the content file to the requesting client consumption device over a second path between the location of the content file and the requesting client consumption device.

In another embodiment, the first node stores a copy of the content file in a storage device at the first node. The first node receives a third request for the content file directly from a second client consumption device via a second N2C channel between the first node and the second client consumption device. The first node sends the copy of the content file to the second client consumption device via the second N2C channel in response to the third request.

In a further embodiment, the first node receives the content file via the second P2P channel in response to the second request and sends the content file to the requesting client consumption device via the first N2C channel or the first P2P channel in response to the first request. In some embodiments, the second path and the first path are the same. In a further embodiment, the first node includes a third radio to communicate control data over a cellular connection between the first node and a mesh network control service (MNCS) device.

In one embodiment, the second radio can operate with 2×2 MIMO with maximum 40 MHz aggregation. This may result in per radio throughput of not more than 300 Mbps in 5 GHz and 150 Mbps in 2.4 GHz. Even with 6 radios (4×5 GHz and 1×2.4 GHz and 1×WAN), the peak physical layer throughput will not need to be more than 1.4 Gbps. A scaling factor of 1.4 may be used to arrive at a CPU frequency requirement. This implies the total processing clock speed in the CPU should not be less than 1.96 GHz (1.4×1.4=1.96 GHz). For example, the Indian ISM band has a requirement of 23 dBm EIRP. Since the WMN 100 needs to function under conditions where the mesh routers communicate with each other between homes, the propagation loss through multiple walls and over distances between homes, the link budget does not support sensitivity requirements for 802.11ac data rates. The per-node throughput may be limited to 300 Mbps per link—peak PHY rate.

In another embodiment, a system includes a POP device having access to content files via at least one of data storage coupled to the POP device or a first point-to-point connection to a first device of an ISP. The system also includes multiple mesh nodes, organized in a WMN, and at least one of the mesh nodes is wirelessly coupled to the POP device. The WMN is a mesh topology in which the multiple mesh nodes cooperate in distribution of the content files to client consumption devices that do not have access to reliable access to the server device of the CDN or in an environment of limited connectivity to broadband infrastructure. A first node of the multiple mesh nodes is a multi-radio, multi-channel (MRMC) device that includes multiple P2P connections to form parts of a network backbone in which the first node wireless connects to other mesh nodes via a first set of WLAN channels reserved for inter-node communication. The first node also includes one or more N2C connections to wireless connect to one or more of the client consumption devices connected to the WMN via a second set of WLAN channels reserved for serving the content files to the client consumption devices. The first node may also include a cellular connection to wireless connect to a second device of the CDN. The second device may be part of a cloud computing system and may host a mesh network control service as described herein. It should be noted that the first point-to-point connection is higher bandwidth than the cellular connection.

Figure 4:
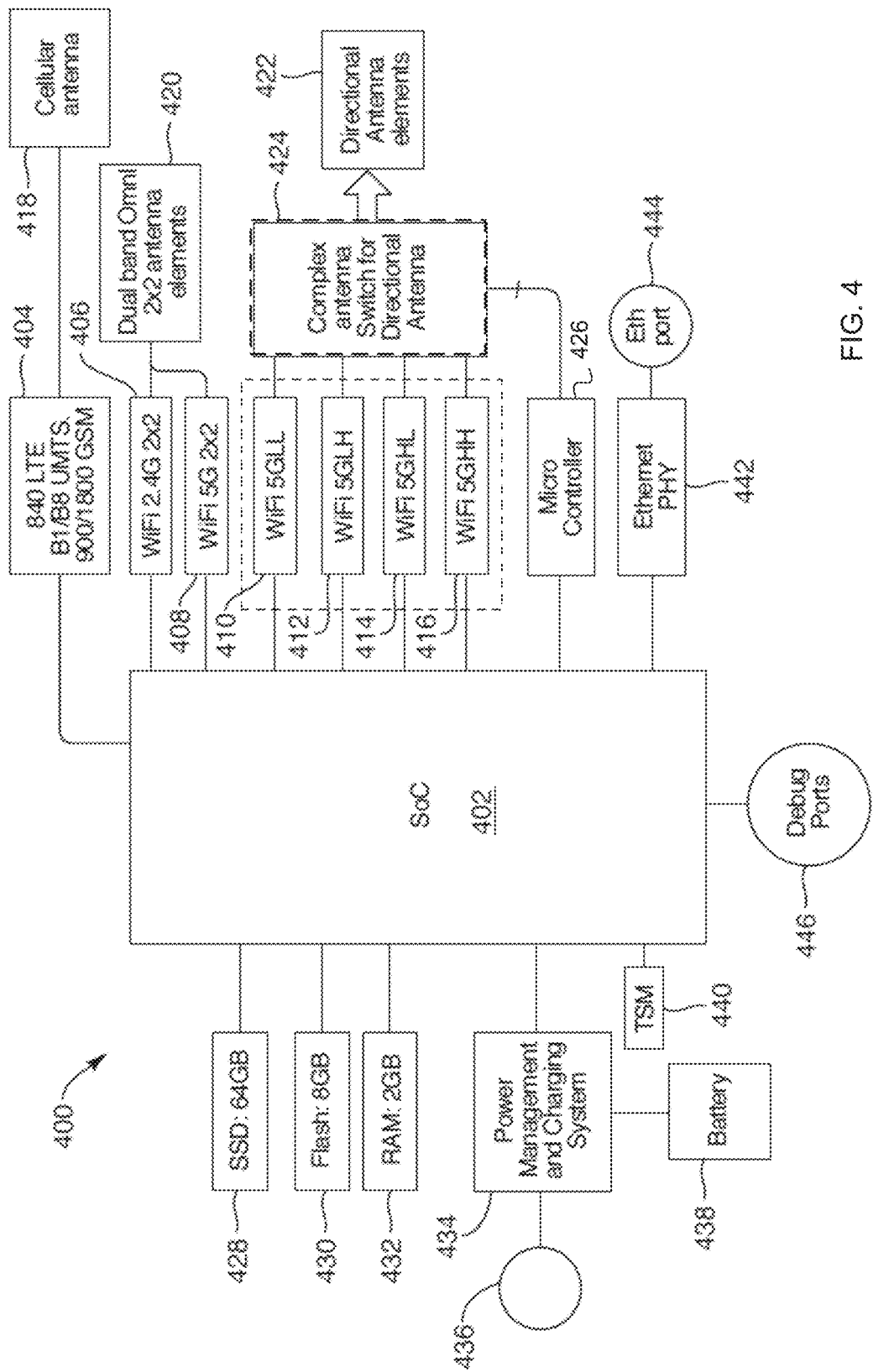
FIG. 4 is a block diagram of a mesh network device according to one embodiment.

FIG. 4 is a block diagram of a mesh network device 400 according to one embodiment. The mesh network device 400 may be one of many mesh network devices organized in a WMN (e.g., WMN 100). The mesh network device 400 is one of the nodes in a mesh topology in which the mesh network device 400 cooperates with other mesh network devices in distribution of content files to client consumption devices in an environment of limited connectivity to broadband Internet infrastructure, as described herein. That is, the client consumption devices do not have Internet connectivity. The mesh network device 400 may be the mini-POP device 102 of FIG. 1. Alternatively, the mesh network device 400 may be any one of the mesh network devices 104-110 of FIG. 1. In another embodiment, the mesh network device 400 is any one of the network hardware devices 202-210 of FIG. 2. In another embodiment, the mesh network device 400 is the mesh node 300 of FIG. 3.

The mesh network device 400 includes a system on chip (SoC) 402 to process data signals in connection with communicating with other mesh network devices and client consumption devices in the WMN. The SoC 402 includes a processing element (e.g., a processor core, a central processing unit, or multiple cores) that processes the data signals and controls the radios to communicate with other devices in the WMN. In one embodiment, the SoC 402 is a dual core SoC, such as the ARM A15 1.5 GHz with hardware network acceleration. The SoC 402 may include memory and storage, such as 2 GB DDR RAM and 64 GB eMMC coupled to the SoC 402 via external HDD interfaces (e.g., SATA, USB3, or the like). The SoC 402 may include multiple RF interfaces, such as a first interface to the first RF radio 404 (e.g., HSCI interface for cellular radio (3G)), a second interface to the WLAN 2.4 GHz radio 406, a third interface to the WLAN 5 GHz radio 408, and multiple interfaces to the WLAN 5 GHz radios, such as on a PCIe bus. Alternatively, the SoC 402 includes as many digital interfaces for as many radios there are in the mesh network device 400. In one embodiment, the SoC 402 is the IPQ8064 Qualcomm SoC or the IPQ4029 Qualcomm SoC. Alternatively, other types of SoCs may be used, such as the Annapurna SoC, or the like. Alternatively, the mesh network device 400 may include an application processor that is not necessarily considered to be a system on a chip.

The mesh network device 400 may also include memory and storage. For example, the mesh network device 400 may include SSD 64 GB 428, 8 GB Flash 430, and 2 GB 432. The memory and storage may be coupled to the SoC 402 via one or more interfaces, such as USB 3.0, SATA, or SD interfaces. The mesh network device 400 may also include a single Ethernet port 444 that is an ingress port for Internet Protocol (IP) connection. The Ethernet port 444 is connected to the Ethernet PHY 442, which is connected to the SoC 402. The Ethernet port 444 can be used to service the mesh network device 400. Although the Ethernet port 444 could provide wired connections to client devices, the primary purpose of the Ethernet port 444 is not to connect to client devices, since the 2.4 GHz connections are used to connect to clients in the WMN. The mesh network device 400 may also include one or more debug ports 446, which are coupled to the SoC 402. The memory and storage may be used to cache content, as well as store software, firmware or other data for the mesh network device 400.

The mesh network device 400 may also include a power management and charging system 434. The power management and charging system 434 can be connected to a power supply 436 (e.g., a 240V outlet, a 120V outlet, or the like). The power management and charging system 434 can also connect to a battery 438. The battery 438 can provide power in the event of power loss. The power management and charging system 434 can be configured to send a SOS message on power outage and backup system state. For example, the WLAN radios can be powered down, but the cellular radio can be powered by the battery 438 to send the SOS message. The battery 438 can provide limited operations by the mesh network device 400, such as for 10 minutes before the entire system is completely powered down. In some cases, power outage will likely affect a geographic area in which the mesh network device 400 is deployed (e.g., power outage that is a neighborhood wide phenomenon). The best option may be to power down the mesh network device 400 and let the cloud service (e.g., back end service) know of the outage in the WMN. The power management and charging system 434 may provide a 15V power supply up to 21 watts to the SoC 402. Alternatively, the mesh network device 400 may include more or less components to operate the multiple antennas as described herein.

The mesh network device 400 includes a first radio frequency (RF) radio 404 coupled between the SoC 402 and an antenna 418 adapted to be connected to a radio that transmits and receives on a cellular frequency. The first RF radio 404 supports cellular connectivity using the antenna 418. In one embodiment, the first RF radio 404 is a wireless wide area network (WWAN) radio and the antenna 418 is a WWAN antenna. WWAN is a form of wireless network that is larger in size than a WLAN and uses different wireless technologies. The wireless network can deliver data in the form of telephone calls, web pages, texts, messages, streaming content, or the like. The WWAN radio may use mobile telecommunication cellular network technologies, such as LTE, WiMAX (also called wireless metropolitan area network (WMAN)), UTMS, CDMA2000, GSM, cellular digital packet data (CDPD), Mobitex, or the like, to transfer data.

In one embodiment, the antenna 418 may include a structure that includes a primary WAN antenna and a secondary WAN antenna. The first RF radio 404 may be a wireless wide area network (WWAN) radio and the antenna 418 is a WWAN antenna. The first RF radio 404 may include a modem to cause the primary WAN antenna, the secondary WAN antenna, or both to radiate electromagnetic energy in the 900 MHz band and 1800 MHz band for the 2G specification, radiate electromagnetic energy in the B1 band and the B8 band for the 3G specification, and radiate electromagnetic energy for the B40 band. The modem may support Cat3 band, 40 TD-LTE, UMTS: Band 1, Band 8, and GSM: 900/1800. The modem may or may not support CDMA. The cellular modem may be used for diagnostics, network management, down time media caching, meta data download, or the like. Alternatively, the first RF radio 404 may support other bands, as well as other cellular technologies. The mesh network device 400 may include a GPS antenna and corresponding GPS radio to track the location of the mesh network device 400, such as moves between homes. However, the mesh network device 400 is intended to be located inside a structure, the GPS antenna and radio may not be used in some embodiments.

The mesh network device 400 includes a first set of wireless local area network (WLAN) radios 406, 408 coupled between the SoC 402 and dual-band omnidirectional antennas 420. A first WLAN radio 406 may support WLAN connectivity in a first frequency range using one of the dual-band omnidirectional antennas 420. A second WLAN radio 408 may support WLAN connectivity in a second frequency range using one of the dual-band omnidirectional antennas 420. The dual-band omnidirectional antennas 420 may be two omnidirectional antennas for 2.4 GHz. The directional antennas 422 may be six sector directional antennas for 5 GHz with two antennas at orthogonal polarizations (horizontal/vertical) or arranged for cross-polarization in each sector. These can be setup with 45 degree 3 dB beam width with 11 dB antenna gain. The dual-band omnidirectional antennas 420 and the directional antennas 422 can be implemented as a fully switchable antenna architecture controlled by micro controller 426. For example, each 5 GHz radio can choose any 2 sectors (for two 2×2 MU-MIMO streams). In additional embodiments, one or more of the dual-band omnidirectional antennas 420 may each be combined with the antenna 418 on the same PCB and may share a common ground (FIGS. 7A-7B), which may be referred to herein as a combination omnidirectional antenna.

The mesh network device 400 includes a second set of WLAN radios 410-416 coupled between the SoC 402 and antenna switching circuitry 424. The second set of WLAN radios 410-416 support WLAN connectivity in the second frequency range using a set of directional antennas 422. The four WLAN radios are exemplary, as there may be more than four WLAN radios to correspond to additional directional antennas 422. The second set of WLAN radios 410-416 is operable to communicate with the other mesh network devices of the WMN. Where there are more directional antennas 422 than radios, each of the second set of WLAN radios 410-416 may be directly connected to a respective one of the directional antennas, and the antenna switching circuitry 424 may provide switching hardware and software to switch one of the WLAN radios to a directional antenna that is not directly connected to one of the radios. For example, the antenna switching circuitry 424 may include one or more switch, each switch being coupled between a directional antenna and one of the WLAN radios to which the directional antenna is not normally directly connected.

The antenna switching circuitry 424 is coupled to a micro controller 426. The micro controller 426 controls the antenna switching circuitry 424 to select different combinations of antennas for wireless communications between the mesh network device 400 and the other mesh network devices, the client consumption devices, or both. For example, the micro controller 426 can select different combinations of the set of directional antennas 422. In one embodiment, the SoC 402 runs a mesh selection algorithm to decide which communication path to use for any particular communication and instructs, or otherwise commands, the micro controller 426 to select the appropriate communication path between a selected radio and a selected antenna. Alternatively, the micro controller 426 can receive indications from the SoC 402 of which radio is to be operating and the micro controller 426 can select an appropriate communication path between a radio (or a channel of the radio) and an appropriate antenna.

In another embodiment, a filter switch bank is coupled between the antenna switching circuitry 424 and the second set of WLAN radios 410-416. In another embodiment, the filter switch bank can be implemented within the antenna switching circuitry 424.

In the depicted embodiment, the first set of WLAN radios include a 2×2 2.4 GHz MIMO radio 406 and a first 2×2 5 GHz MIMO radio 408. The second set of WLAN radios includes a second 2×2 5 GHz MIMO radio 410 ("5GLL"), a third 2×2 5 GHz MIMO radio 412 ("5GLH"), a fourth 2×2 5 GHz MIMO radio 414 ("5GHL"), and a fifth 2×2 5 GHz MIMO radio 416 ("5GHH"). The dual-band omnidirectional antennas 420 may include a first omnidirectional antenna and a second omnidirectional antenna (not individually illustrated in FIG. 4). The set of directional antennas 422 may include antennas of any combination of vertical orientation, horizontal orientation, or angled polarization. In one embodiment, there may be six antennas, each being a set of cross-polarized antennas as will be discussed in additional detail.

In one embodiment, the mesh network device 400 can handle antenna switching in a static manner. The SoC 402 can perform sounding operations with the WLAN radios to determine a switch configuration. Switching may not be done on a per packet basis or at a packet level. The static switch configuration can be evaluated a few times a day by the SoC 402. The SoC 402 can include the intelligence for switching decision based on neighbor sounding operations done by the SoC 402. The micro controller 426 can be used to program the antenna switching circuitry 424 (e.g., switch matrix) since the mesh network device 400 may be based on CSMA-CA, not TDMA. Deciding where the data will be coming into the mesh network device 400 is not known prior to receipt, so dynamic switching may not add much benefit. It should also be noted that network backbone issues, such as one of the mesh network devices becoming unavailable, may trigger another neighbor sounding process to determine a new switch configuration. Once the neighbor sounding process is completed, the mesh network device 400 can adapt a beam patter to be essentially fixed since the mesh network devices are not intended to move once situated.

Figure 5A:
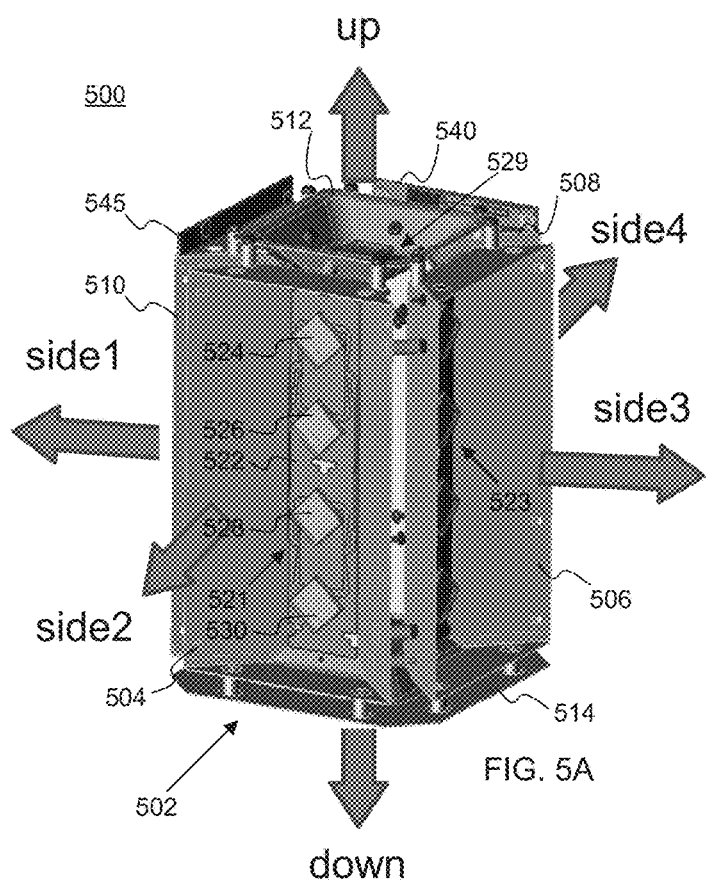
FIG. 5A illustrates a multi-radio, multi-channel (MRMC) network device according to one embodiment.

FIG. 5A illustrates a multi-radio, multi-channel (MRMC) network device 500 according to one embodiment. The MRMC network device 500 may include a metal housing 502 that is elongated, e.g., has a height greater than a width, and that includes a number of sides that make up a perimeter of the metal housing. The metal housing 502 may be made of stainless steel or some other metal. In the depicted embodiment, the metal housing 502 has six sides, a first side, a second side, a third side, and a fourth side that are rectangular and form a length of the metal housing 502, a fifth side at a top of the metal housing, and a sixth side at a bottom of the metal housing 502. Additional or fewer sides are envisioned. Each of the fifth side and the sixth side may be square.

With further reference to FIG. 5A, the metal housing may form a number of chambers (e.g., isolation chambers) that correspond to respective sides and open to the outside of the metal housing. For example, the metal housing 502 may include a first metal section 504 that forms a first chamber, a second metal section 506 that forms a second chamber, a third metal section 508 that forms a third chamber, and a fourth metal section 510 that forms a fourth chamber at the four rectangular sides of the metal housing, a fifth metal section 512 that forms a top chamber at the top of the metal housing, and a sixth metal section 514 that forms a bottom chamber at the bottom of the metal housing 502. Each chamber may be formed from multiple reflective sidewalls, to reflect electromagnetic energy away from the metal housing, and that also provide electromagnetic isolation from other ambient electromagnetic waves.

In various embodiments, for example, four sidewalls extend from a back wall to form each chamber that is oriented to an outside of the metal housing 502. The four sidewalls are made of reflective metal to directionally reflect electromagnetic energy. Use of more than four sidewalls is envisioned in alternative embodiments. As depicted, each of the metal sections 504, 506, 508, and 510 may form a chamber shaped as a truncated triangular prism structure, which is defined by a back wall and four sidewalls. The four sidewalls may include two rectangular sidewalls each angled from a long edge of the back wall towards a nearest intersection of two sides of the metal housing, a top sidewall located between the two rectangular sidewalls and the back wall at a top of the chamber, and a bottom sidewall located between the two rectangular sidewalls and the back wall at a bottom of the chamber. The area near each back wall may define a recessed region that is narrower than a mouth of each chamber. Furthermore, the fifth metal section 510 may form the top chamber and the sixth metal section 512 may form the bottom chamber. Each of the top chamber and the bottom chamber may be shaped as a truncated pyramid structure defined by a back wall and four angled sidewalls.

In various embodiments, an antenna may be disposed within each chamber, e.g., coupled to the back wall of the chamber. For example, a first antenna 521 may be disposed in the first chamber, a second antenna 523 may be disposed within the second chamber, a third antenna (not visible) may be disposed within the third chamber, and a fourth antenna (not visible) may be disposed within the fourth chamber. Furthermore, a fifth antenna 529 may be disposed within the top chamber and a sixth antenna (not illustrated) may be disposed within the bottom chamber. Each chamber may electrically isolate the antenna of the chamber from the antenna of a different chamber, so that each antenna generates a separate radiation pattern in one of the six different directions of the MRMC network device 500, as shown in FIG. 5B.

Each of the first, second, third, and fourth antennas may be rectangular in shape, formed on a printed circuit board (PCB) (such as a microstrip PCB), and may each be an antenna pair, such as a pair of phased array patch antennas. Each of the fifth and sixth antennas may be square in shape, formed on a separate PCB, and also may each be an antenna pair, such as a pair phased array patch antennas. The patch elements (not visible) of each phased array patch antenna may be diamond-shaped. In various embodiments, the first antenna 521 further includes parasitic elements 524, 526, 528, and 530 retained at a predetermined distance from each respective diamond-shaped patch element, to act as a parasitic antenna element within the phased array patch antenna. In one embodiment, the predetermined distance is a gap of about 3 mm, although more or less distance may also be appropriate. In one embodiment, each parasitic element may also be diamond-shaped to correspond to the diamond-shaped patch elements and may have a first surface area that is at least 25% larger than a second surface area of a corresponding patch element. In various embodiments, the parasitic elements are planar metal members, also be diamond-shaped, and are retained at the predetermined distance by way of a non-conductive material such as a dielectric. Various materials have different dielectric constants, with the materials having a dielectric constant closest to 1.0 (that of air) being preferred for electromagnetic operation but not necessarily for cost. Use of different materials is mentioned hereinafter only by way of example of such dielectric materials.

The MRMC network device 500 may further include a first combination omnidirectional antenna 540 and a second combination omnidirectional antenna 545, each of which may include the antenna 418 and the dual-band omnidirectional antenna 420 that share a common ground (discussed in more detail with reference to FIG. 4). The first combination omnidirectional antenna 540 and the second combination omnidirectional antenna 545 may be attached to top sidewalls of adjacent chambers, e.g., to the top sidewall of the third chamber formed by the third metal section 508 and to the top sidewall of the fourth chamber formed by the fourth metal section 510, respectively.

Figure 5B:
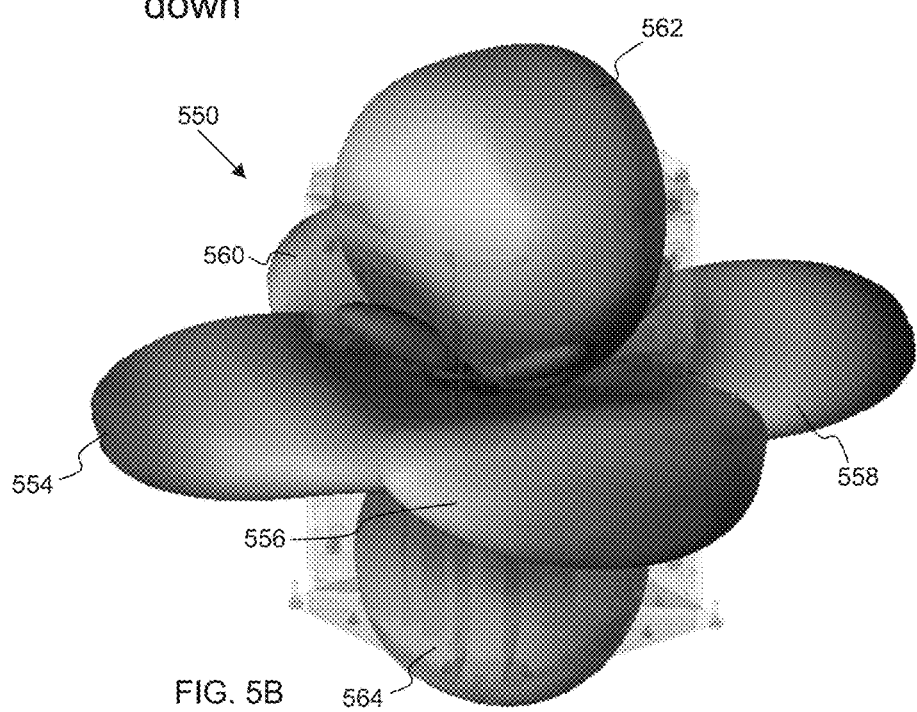
FIG. 5B illustrates a set of radiation patterns of the MRMC device of FIG. 5A according to one embodiment.

FIG. 5B illustrates a set of radiation patterns 550 of the MRMC network device 500 of FIG. 5A according to one embodiment. With additional reference to FIG. 5A, a number of radios may also be located on a main circuit board (1402 in FIG. 14) located within an inner chamber of the metal housing 502, e.g., located between the six metal sections 504, 506,508, 510, 512, and 514. Each antenna may be coupled to a separate radio, and in alternative embodiments, some antennas share a radio via switching circuitry as previously discussed with reference to FIG. 4. Each radio may be operable to cause the antenna to which it is coupled to radiate electromagnetic energy outwardly away from the metal housing 502. Due to the structure of the metal section that defines each chamber, the chambers may each reflect the electromagnetic energy in a different direction, e.g., away from the metal housing in the four directions corresponding to the four sides, out the top, and out the bottom of the metal housing 502 as illustrated in FIG. 5B, effectively providing spherical radiation coverage of electromagnetic energy.

More specifically, the set of radiation patterns 550 may include a first radiation pattern 554 out of the first metal section 504, a second radiation pattern 556 out of the second metal section 506, a third radiation pattern 558 out of the third metal section 508, a fourth radiation pattern 560 out of the fourth metal section 510, a fifth radiation pattern 562 out of the fifth metal section 512, and a sixth radiation pattern 564 out of the sixth metal section 514. In this way, the chambers formed by these metal sections may play a role with directing the radiation pattern of each respective antenna, and also to isolate each respective antenna from both the radiation patterns of other antennas of the MRMC network device 500 and ambient electromagnetic waves or interference.

FIG. 6A illustrates a phased array patch antenna 621 on a printed circuit board (PCB) 622 according to one embodiment. The PCB 622 may be rectangular and fit within the recessed region of any of the chambers formed by the metal sections 504, 506, 508, and 510. The phased array patch antenna 621 may be similar to the first antenna 521 illustrated in FIG. 5A, but without the parasitic elements (for clarity). The phased array patch antenna 621 may include a series of patch elements, e.g., in this case four patch elements: a first patch element 624, a second patch element 626, a third patch element 628, and a fourth patch element 630. The four patch elements is aligned along a first axis and is dual fed with two sets of metal lines, a first set containing a first RF feed 641 and a second set containing a second RF feed 645. Each of the first RF feed 641 and the second RF feed 645 is coupled to a radio on the main circuit board.

More specifically, the four patch elements may be conductive and electrically connected in parallel with a first set and a second set of metal lines. The four patch elements may be coupled to a ground (not illustrated) through the back of the PCB 622, which will be discussed in more detail. The first set of metal lines, located on a first side of the four patch elements, includes a first metal line 623 to connect the first patch element 624 and the second patch element 626 (e.g., a first pair of patch elements), and a second metal line 625 to connect the third patch element 628 and the fourth patch element 630 (e.g., a second pair of patch elements). A third metal line 627 connects the first metal line 623 and the second metal line 625 together, and the first RF feed 641 may be disposed approximately at a center of the third metal line 627.

The second set of metal lines, located on a second side of the four patch elements, includes a fourth metal line 633 to connect the first patch element 624 and the second patch element 626, and a fifth metal line 635 to connect the third patch element 628 and the fourth patch element 630. A sixth metal line 637 may connect the fourth metal line 633 and the fifth metal line 635 together, and the second RF feed 645 may be disposed approximately at a center of the fifth metal line 635.

More specifically, the first set of metal lines (along the left of the four patch elements) and the four patch elements form a first antenna that radiates electromagnetic energy with a first polarization pattern of approximately a positive 45 degrees and the second set of metal lines (along the right of the patch elements) and the four patch elements form a second antenna that radiates electromagnetic energy with a second polarization pattern at approximately a negative 45 degrees, which together cumulatively form a cross-polarization radiation pattern. The combination of the first antenna and the second antenna provides full benefits of a multiple input multiple output (MIMO) antenna, although other single input and single output antennas may also be deployed within each chamber. By transmitting and receiving on dual-channels and dual-streams provided by MIMO architecture, throughput may be higher and a lower envelope correlation coefficient (ECC) is achievable, which provides better quality and stronger simultaneous radiation patterns of the co-located first antenna and second antenna.

Because the metal housing 502 is taller than wide and the PCB 622 is elongated along the taller side, the cross-polarization radiation pattern that is created is relatively flat, e.g., shaped like a fin. For example, the length ($L_1$) may be substantially longer than the width ($W_1$) and the center-to-center distance ($D_1$) between the two sets of patch elements may be sized to reduce amount of gain drop off. In one embodiment, by way of example, the length may be 166 mm, the width 34 mm, and the distance between the two sets of patch elements may be 40 mm. The center-to-center distance ($D_1$) may, for example, be sized to less than the length of one wavelength of the frequency of the electromagnetic radiation emitted by the phased array patch antenna 621.

With still more specificity as to the first set of metal lines, being exemplary of also the second set of metal lines, the first metal line 623 includes multiple portions: a first portion extending from the first patch element 624 in a first direction to a first end; a second portion extending from the first end in a second direction to a second end; and a third portion extending from the second end in a third direction to the second patch element 626. The second portion may taper from the first end and the second end to a first center of the second portion, and the first end and the second end may each include a clipped corner. The second metal line 625 includes multiple portions: a fourth portion extending from the third patch element 628 in the first direction to a third end; a fifth portion extending from the third end in the second direction to a fourth end; and a sixth portion extending from the fourth end in the third direction to the fourth patch element 630. The fifth portion may taper from the third end and the fourth end to a second center of the fifth portion, and the third end and the fourth end may each include a clipped corner. A third metal line 627 includes multiple portions: a seventh portion extending from the first center of the second portion in the first direction to a fifth end; an eighth portion extending from the fifth end in the second direction to a sixth end; and a ninth portion extending from the sixth end in the third direction to the second center of the fifth portion. The eighth portion may taper from the fifth end and the sixth end to a third center of the eighth portion, and each of the fifth end and the sixth end may include a clipped corner. The first RF feed 641 is disposed at approximately the third center of the eighth portion, and a first radio is coupled to the first RF feed 641.

The detailed description of the first set of metal lines (e.g., the first metal line 623, the second metal line 625, and the third metal line 627) applies equally to the second set of metal lines (e.g., the fourth metal line 633, fifth metal line 635, and sixth metal line 637), which are disposed symmetrically at the right sides of the four patch elements 624, 626, 628, and 630.

FIG. 6B illustrates a phased array patch antenna 648 on a PCB 652 according to another embodiment. The PCB 622 may be rectangular and fit within the recessed region of any of either of the top chamber formed by the fifth metal section 512 or the bottom chamber formed by the sixth metal section 514. The phased array patch antenna 648 may be similar to the first antenna 521 of FIG. 5A configured with four patch elements. Fewer or more patch elements are envisioned depending on the size of the MRMC network device 500. The phased array patch antenna 648 may therefore include: a first patch element 654, a second patch element 656 (or a first set of patch elements), a third patch element 658, and a fourth patch element 660 (or a second set of patch elements). The first patch element 654 and the second patch element 656 are aligned along a first axis, and the third patch element 658 and the fourth patch element 660 are aligned along a second axis parallel to the first axis. The first pair and second pair of patch elements are dual-fed with two sets of metal lines, a first set containing a first RF feed 671 and a second set containing a second RF feed 675. Each of the first RF feed 671 and the second RF feed 675 is coupled to a radio on the main circuit board, e.g., to a second radio.

The four patch elements may be conductive and electrically connected in parallel with a first set and a second set of metal lines. The four patch elements may be coupled to a ground (not illustrated) through the back of the PCB 652, which will be discussed in more detail. The first set of metal lines, located on a first side of the four patch elements, includes a first metal line 653 to connect the first patch element 654 and the second patch element 656 (e.g., a first set of patch elements), and a second metal line 655 to connect the third patch element 658 and the fourth patch element 660 (e.g., a second set of patch elements). A third metal line 657 connects the first metal line 653 and the second metal line 655 together, and includes a first RF feed 671 that may be disposed approximately at a center of the third metal line 657.

The second set of metal lines, located on a second side of the four patch elements, includes a fourth metal line 663 to connect the first patch element 654 and the second patch element 656, and a fifth metal line 665 to connect the third patch element 658 and the fourth patch element 660. A sixth metal line 667 connects the fourth metal line 663 and the fifth metal line 665 together, and includes a second RF feed 675 that may be disposed approximately at a center of the sixth metal line 667. The first RF feed 671 may feed a first patch antenna and the second RF feed 675 may feed a second patch antenna, which cumulatively produce a cross-polarization radiation pattern.

More specifically, the first set of metal lines (along the left of the four patch elements) and the four patch elements form a first antenna that radiates electromagnetic energy with a first polarization pattern of approximately a positive 45 degrees and the second set of metal lines (along the right of the patch elements) and the four patch elements form a second antenna that radiates electromagnetic energy with a second polarization pattern at approximately a negative 45 degrees, which together cumulatively form a cross-polarization radiation pattern. Because the PCB 652 is square with the different sets of patch elements located side by side, the cross-polarization radiation pattern is fatter and rounder (than the side radiation patterns) as illustrated with the fifth radiation pattern 562 and the sixth radiation pattern 564 in FIG. 5B. For example, the width ($W_2$) and the length ($L_2$) may be the same distance. In one embodiment, that dimensions are 77 mm by 77 mm square.

With still more specificity as to the first set of metal lines, the first metal line 653 includes multiple portions: a first portion extending from the first patch element 654 in a first direction to a first end; a second portion extending from the first end in a second direction to a second end; and a third portion extending from the second end in a third direction to the second patch element 656. The second portion may taper from the first end and the second end to a first center of the second portion, and the first end and the second end may each include a clipped corner. The second metal line 655 includes multiple portions: a fourth portion extending from the third patch element 658 in the first direction to a third end; a fifth portion extending from the third end in the second direction to a fourth end; and a sixth portion extending from the fourth end in the third direction to the fourth patch element 660. The fifth portion may taper from the third end and the fourth end to a second center of the fifth portion, and the third end and the fourth end may each include a clipped corner.

The third metal line 657 includes multiple portions: a seventh portion extending from the first center of the second portion in the first direction to a fifth end; an eighth portion extending from the fifth end in the second direction until a sixth end, the eighth portion tapering from the fifth end towards the sixth end of the eighth portion; a ninth portion extending from the sixth end in a fourth direction to a seventh end; a tenth portion extending from the seventh end in the third direction to an eighth end; an eleventh portion extending from the eighth end in a fifth direction to a ninth end; a twelfth portion extending from the ninth end in a sixth direction, opposite the first direction, until a tenth end, the twelfth portion tapering from the tenth end towards the ninth end of the twelfth portion; and a thirteenth portion extending from the tenth end in the third direction to the second center of the fifth portion. The fifth end and the tenth end may each include a clipped corner, and the first RF feed 671 is disposed at a third center of the tenth portion. A second radio, which is disposed on the main circuit board, is coupled to the first RF feed 671.

The detailed description of the first set of metal lines (e.g., the first metal line 653, the second metal line 655, and the third metal line 657) applies equally to the second set of metal lines (e.g., the fourth metal line 663, fifth metal line 665, and sixth metal line 665), which are disposed symmetrically at the right sides of the four patch elements 654, 656, 658, and 660.

FIG. 6C illustrates the phased array patch antenna 648 of FIG. 6B within one of the fifth metal section 512, forming the top chamber, or the sixth metal section 514, forming the bottom chamber, of the MRMC network device 500 of FIG. 5A according to one embodiment. The phased array patch antenna 648 may further include a number of parasitic elements 684, 686, 688, and 690, corresponding respectively to the four patch elements 654, 656, 658, and 660, retained at a predetermined distance from each respective patch element. The surface area of each of the parasitic elements may be about a fourth (or more) larger than its corresponding patch element. In one example, the underlying patch elements may be 14 mm by 14 mm and the floating, parasitic elements may be approximately 18 mm by 18 mm. In this way, the parasitic elements within the phased array patch antenna 648 helps increase the gain of the electromagnetic radiation patterns in a direction perpendicular to a first plane of with the PCB 652. Each parasitic element provides parasitic coupling between each patch element and a corresponding parasitic element positioned opposite the patch. Such parasitic elements (e.g., parasitic elements 524, 526, 528, and 530 of FIG. 5A) may also be employed with the phased array patch antenna 621 to increase the gain and directionality of the electromagnetic radiation patterns coming out of the sides of the metal housing 502, e.g., perpendicular to the PCB 622. Accordingly, the parasitic elements are sometimes referred to as parasitic patches or director patches.

FIG. 7A illustrates a combination omnidirectional antenna 700 in which a wireless wide area network (WWAN) antenna 701 and a wireless local area network (WLAN) antenna 725 share a common ground element 702 on a PCB (e.g., a microstrip PCB), according to one embodiment. The common ground element 702 may be a ground patch element, which is positioned between the WWAN antenna 701 and the WLAN antenna 725. In one embodiment, the WWAN antenna 701 and the WLAN antenna 725 are adapted for simultaneous operation.

In a first embodiment, the WWAN antenna 701 may have a planar inverted F-antenna-type structure. Rather than a ground plane, the WWAN antenna 701 may include a first ground element 703, which may be P-shaped, and a tapered launcher structure 706 parasitically coupled to the first ground element 703. The first ground element 703 includes a ground feed element 703A. The tapered launcher structure 706 may be triangular in shape include a feed element extending opposite to the ground feed element 703A. A hypotenuse of the triangle shaped of the tapered launcher structure 706 may oppose the P-shape of the first ground element 703, to provide additional surface area for parasitic coupling to ground. A first RF feed 704 is attached to the feed element of the tapered launcher structure 706. The first RF feed 704 may be coupled to a radio on the main circuit board (1402 in FIG. 14). The WWAN antenna 700 may further include a dual-feed arm 708, extending from the tapered launcher structure 706, that is parasitically coupled to a dual-parasitic arm 712. The dual-parasitic arm 712 is connected to the common ground element 702. A parasitic element is an element of the WWAN antenna 701 that is not driven directly by an RF feed. The dual-feed arm 708 is fed by the first RF feed 704.

In the first embodiment, the dual-feed arm 708 may be a folded monopole structure that includes a first L-shaped element 709 and a layered portion 710 that connects to the first L-shaped element 709. The dual-feed arm 708 connects to the tapered launcher structure 706 at a first end and includes the first L-shaped element 709 at a second end opposite the first end, about a third of the distance away from the common ground element 702. The first L-shaped element 709 may extend about half way across a height of the tapered launcher structure 706. The layered element 710 connects to the first L-shaped element 709 and is positioned tightly between the tapered launcher structure 706 and the first L-shaped element 709. The layered element 710 includes a number of switch-back folds that are parallel to each other and to the dual-feed arm 708. In one embodiment, the layered element 710 includes five switch-back folds, where the fifth switch-back fold may be discontinuous. Fewer or more switch-back folds are envisioned in alternative embodiments.

In the first embodiment, the dual-parasitic arm 712 may be a second folded monopole antenna, connected to the common ground element 702, which includes a second L-shaped element 713 and an extension element 715. The dual-parasitic arm 712 connects to the common ground element 702 at a first end, and includes the second L-shaped element 713 at a second end opposite to the first end. The second L-shaped element 713 is parasitically coupled to the first L-shaped element 709 of the dual-feed arm 708, and therefore is driven parasitically by a combination of the tapered launcher structure 706 and the dual-feed arm 708. The extension element 715 doubles back parallel to the dual-parasitic arm 712 towards the common ground element 702, leaving a solid element between the second L-shaped element 709 and the extension element 715. The current flowing within the dual-parasitic arm 712 may be parasitically induced by the current flowing through the dual-feed arm 708.

Further to the first embodiment, the WLAN antenna 725 may have a self-coupled, inverted F-antenna structure. The WLAN antenna 725 includes a folded monopole structure 728 on a first side of the PCB, and on a second side of the PCB, a grounding element 711 and a parasitic T-shaped structure 730. The folded monopole structure 728 connects on a first end to the common ground element 702, and includes multiple portions: a first portion that extends away from a top of the common ground element 702 in a first direction until a first fold; a second portion that extends from the first fold in a second direction until a second fold; and a third portion that extends from the second fold in a third direction, the third direction being opposite to the first direction and thus back towards the common ground element 702. One side of the top of the T-shaped structure 730 is connected approximately halfway along the first portion of the folded monopole structure 728.

In one embodiment, a second RF feed 726 is disposed to the other side of the top of the T-shaped structure 730. The second RF feed 726 may be coupled to a radio on the main circuit board. The bottom leg of the T-shaped structure 730 is parasitically coupled to the end of the third portion of the folded monopole structure 728. The grounding element 711 attaches to a bottom of the common ground element 702 and is parasitically coupled to the RF-feed-end of the T-shaped structure. The WLAN antenna 725 is fed at the second RF feed 726. This combination of structures provides an omnidirectional WLAN antenna that may radiate electromagnetic energy at a first frequency, e.g., 2.5 GHz.

FIG. 7B illustrates a combination omnidirectional antenna 750 in which a WWAN antenna 751 and a WLAN antenna 775 share a common ground element 702 on a PCB, according to a second embodiment. The common ground element 702 may be a ground patch element which is positioned between the WWAN antenna 751 and the WLAN antenna 775. In one embodiment, the WWAN antenna 751 and the WLAN antenna 775 are adapted for simultaneous operation.

In the second embodiment, while some of the antenna structures are similar, others vary. The WWAN antenna 751 may still have a planar inverted F-antenna-type structure. Rather than a ground plane, the WWAN antenna 751 includes a second ground element 753. The second ground element 753 may be U-shaped, and include a ground extension element 754 extending off a bottom side and a folded monopole structure 756 extending off of a top side of the second ground element 753. The ground extension element 754 is oriented opposite to the folded monopole structure 756. The folded monopole structure 756 includes multiple portions: a first portion that extends off the top side of the second ground element 753 in a first direction (which is the same direction as the ground extension 754) until a first fold; a second portion extending from the first fold in a second direction until a second fold; and a third portion that extends from the second fold in a third direction, the third direction being opposite to the first direction and thus back towards the second ground element 753.

The WWAN antenna 751 may further include a dual-feed arm 758 and a dual-parasitic arm 752 that is parasitically coupled to the dual-feed arm 758. The dual-feed arm 758 is parasitically coupled to the second ground element 753, and includes multiple portions: a first portion that extends from a first RF feed 755 in a fourth direction, opposite the second direction, until a first fold; a second portion that extends from the first fold in the first direction until a second fold; an L-shaped element 759 that extends from the second fold in the second direction; a layered element 760 that begins with an extension from adjacent the first fold on the second portion, and includes multiple switch-back folds positioned tightly between the first portion 757 and the L-shaped element 759; and a layered extender 762 that extends off of the final switch-back fold beyond the L-shaped element 759 in the first direction. The first RF feed 755 may be located between the ground extension 754 and a first end of the first portion of the dual-feed arm 758, and may be connected from a back side of the PCB. The first RF feed 755 may be coupled to a radio on the main circuit board (1402 in FIG. 14). In one embodiment, the connection point of the layered element 760 is at a mid-point of the first of the multiple switch-backs folds. There may be six total switch-back folds, although fewer or more switch-back folds are envisioned. The dual-feed arm 758 may be fed by the first RF feed 755.

In the second embodiment, the dual-parasitic arm 752 is connected to the common ground element 702 at a first end and includes multiple portions: a first portion that extends the third direction until a solid end element, which is parasitically coupled to the L-shaped element 759 of the dual-feed arm 758, and the extension element 715 that extends from the solid element in the first direction back towards the common ground element 702. The first portion is parallel to the extension portion 715. An end of the extension element 715 may terminate adjacent to the common ground element 702 in one embodiment. The current flowing within the dual-parasitic arm 752 may be parasitically induced by the current flowing through the dual-feed arm 758.

Further to the second embodiment, the WLAN antenna 775 may have a planar inverted F-antenna structure, which is also connected to the common ground element 702. The WLAN antenna includes a folded monopole structure 778, a feed arm structure 780, and a second ground extension 784. The folded monopole structure 778 includes multiple portions: a first portion that extends from the common ground element 702 in the first direction to a first fold; a second portion that extends from the first fold in the second direction until a second fold; and a third portion that extends from the second fold in the third direction. The feed arm structure 780 connects between a midpoint of the first portion of the folded monopole structure 778 to a second RF feed 776. The second RF feed 776 may be coupled to a radio on the main circuit board. The second ground extension 784 extends in the first direction from the common ground element 702 and may connect (or be coupled) to the RF-feed-end of the feed arm structure 780 in one embodiment. The WLAN antenna 775 is fed at the second RF feed 776. This combination of structures provides an omnidirectional WLAN antenna that may radiate electromagnetic energy at a first frequency, e.g., 2.5 GHz.

Figure 8:
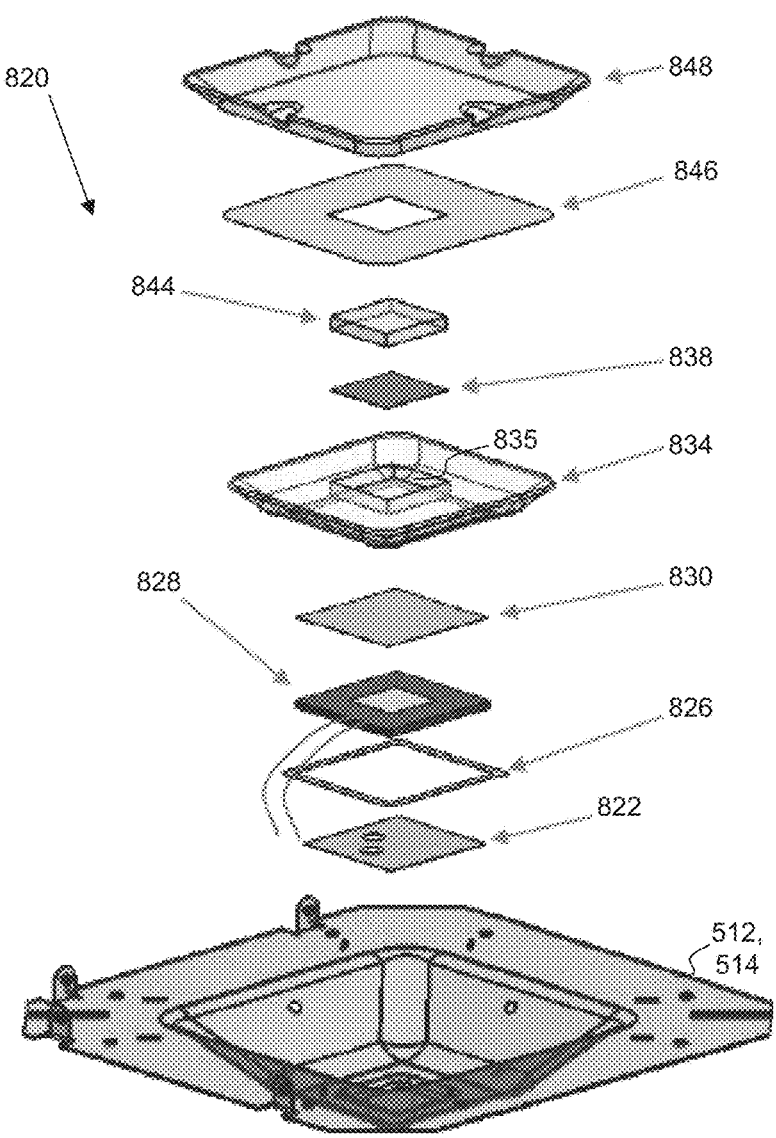
FIG. 8 illustrates a foam-layer-based patch antenna integrated within a chamber of the MRMC network device of FIG. 5A according to an alternative embodiment.

FIG. 8 illustrates a foam-layer-based patch antenna 820 integrated within a chamber of the MRMC network device 500 of FIG. 5A according to an alternative embodiment. In this alternative embodiment, the retaining of a parasitic element the predetermined distance away from a patch may be performed using a foam material. Foam (e.g., Syrofoam or urethane foam) has a dielectric constant of 1.01, which is very close to that of air having a dielectric constant of 1.0.

More specifically, the foam-layer-based patch antenna 820 may include a number of layers, including but not limited to, a conductive adhesive 822, a frame adhesive 826, a PCB with a patch antenna 828, a third adhesive 830, a first foam layer 834, a fourth adhesive 838, a parasitic element 844, a fifth adhesive 846, and an optional top foam layer 848 to enclose and seal the other layers. Note that some of these layers are optional depending on whether the layers are adhered together or are compressed together in some other way, e.g., via fasteners or simple compression with an outer layer such as the top foam layer 848.

In one embodiment, the first foam layer 834 may be of a thickness of the predetermined distance (e.g., about 3 mm in one embodiment), and include raised strips formed into an open-face box 835 positioned on an opposite side of the first foam layer 834 from a patch within the patch antenna 828. The parasitic element 844 is disposed within the open-faced box of the foam layer, to act as a parasitic antenna element to the patch. In other embodiments, the open-face box 835 may be eliminated or some other structure may be used to orient the parasitic element 844 to be aligned with the patch of the patch antenna.

Further note that the alternative embodiment of FIG. 8 discloses an approach that may be employed within either or both of the phased array patch antennas 621 and 648, e.g., to retain each of the parasitic elements 684, 686, 688, and 690 the predetermined distance away from the corresponding patch elements of either or both of the phased array patch antennas 621 and 648.

FIGS. 9A, 9B, 9C, 9D, and 9E illustrate a polymer-based patch antenna 900 within a chamber of the MRMC network device of FIG. 5A according to an alternative embodiment. FIG. 9A is an antenna frame 902 made of a polymer, such as Zeonex® RS420, which has a dielectric constant of approximately 2.3. The antenna frame 902 may be an injection molded part to include a block retainer 904 with which to retain a parasitic element 906 as illustrated in FIGS. 9B and 9C.

In one embodiment, the antenna frame 902 may include a recessed portion 905 (FIG. 9B) around the block retainer 904, into which may be disposed (and optionally adhered) a PCB 908 containing a patch antenna (FIG. 9D). FIG. 9E is a cross-section view of a metal section 910 that forms a chamber in which is located the antenna frame 902 holding the parasitic element 906 a predetermined distance from the patch of the patch antenna disposed the PCB 908. Note that tabs on a bottom portion of the block retainer 904 may enforce a gap of the predetermined distance between the parasitic element 906 and the PCB 908 with a minimal amount of polymer material, thus leaving mostly air within the gap.

In various embodiments, the polymer-based patch antenna 900 may be employed as another approach within either or both of the phased array patch antennas 621 and 648, e.g., to retain each of the parasitic elements 684, 686, 688, and 690 the predetermined distance away from the corresponding patch elements of either or both of the phased array patch antennas 621 and 648.

FIG. 10A is an exploded view of a side antenna assembly 1000, according to one embodiment. The side antenna assembly 1000 may include, but not be limited to, the phased array patch antenna 621 of FIG. 6A disposed within the recessed region of a chamber formed by a metal section 1004. The metal section 1004 may correspond to any of the metal sections 504, 506, 508, and 510 illustrated in FIG. 5.

The phased array patch antenna 621 may further include a pair of conductive foam 1005A and 1005B, a first coax cable 1007A, a second coax cable 1007B, the PCB 622, and an antenna frame 1021. The conductive foam 1005A, 1005B may be positioned between the PCB 622 and the back wall of the metal section 1004 to help parasitically couple the patch elements disposed on the PCB 622 to ground (e.g., the metal section 1004 that is grounded) through the PCB 622. The first coax cable 1007A may connect between the first RF feed 641 and a radio on the main circuit board through a first aperture 1003A of the metal section 1004. The second coax cable 1007B may connect between the second RF feed 645 and the radio through a second aperture 1003B of the metal section 1004. In various embodiments, although shown formed in the back wall, the first aperture 1003A and the second aperture 1003B may also be formed in any of the sidewalls of the metal section 1004.

The antenna frame 1021 may be made of any dielectric material such as polymer (or equivalent) material, e.g., polycarbonate/acrylonitrile butadiene styrene (PC/ABS), which has a dielectric constant of 3.0, or the like. The antenna frame 1021 may be attached between at least two of the sidewalls of the metal section such as to be oriented in a second plane parallel to the first plane of the PCB 622, and to retain the parasitic elements 524, 526, 528, and 530 at the predetermined distance from respective patch elements 624, 626, 628, and 630 on the PCB 622. More specifically, the antenna frame 1021 may include a number of frame elements, which form openings in the antenna frame 1021, including a first frame element 1084 to retain the first parasitic element 524, a second frame element 1086 to retain the second parasitic element 526, a third frame element 1088 to retain the third parasitic element 528, and a fourth frame element 1090 to retain the fourth parasitic element 530 at the predetermined distance from the corresponding patch elements 624, 626, 628, and 630. Each frame element may include one or more extension tabs 1095 with a depth sized to the predetermined distance. Each frame element and extension tabs may be minimized in size to reduce the amount of polymer-based material existing between the parasitic elements and the patch elements, thus maximizing an amount of parasitic coupling between the patch elements and the parasitic elements.

FIG. 10B illustrates a completely assembled side antenna assembly 1000, according to one embodiment. As illustrated, the side antenna assembly 1000 has now been assembled with the phased array patch antenna 621 and the antenna frame 1021 mutually aligned and attached to the back wall of the metal section 1004 in the recessed region previously mentioned. The extension tabs 1095 may abut up against the PCB 622, thus ensuring to keep the gap defining the predetermined distance constant. In this way, the reflective metal of the angled sidewalls, the top sidewall, and the bottom sidewall can now reflect the electromagnetic radiation pattern produced by the patch elements of the phased array patch antenna 621 directionally to the outside of the metal housing 502, e.g., out one of the sides of the metal housing.

Figure 11A:
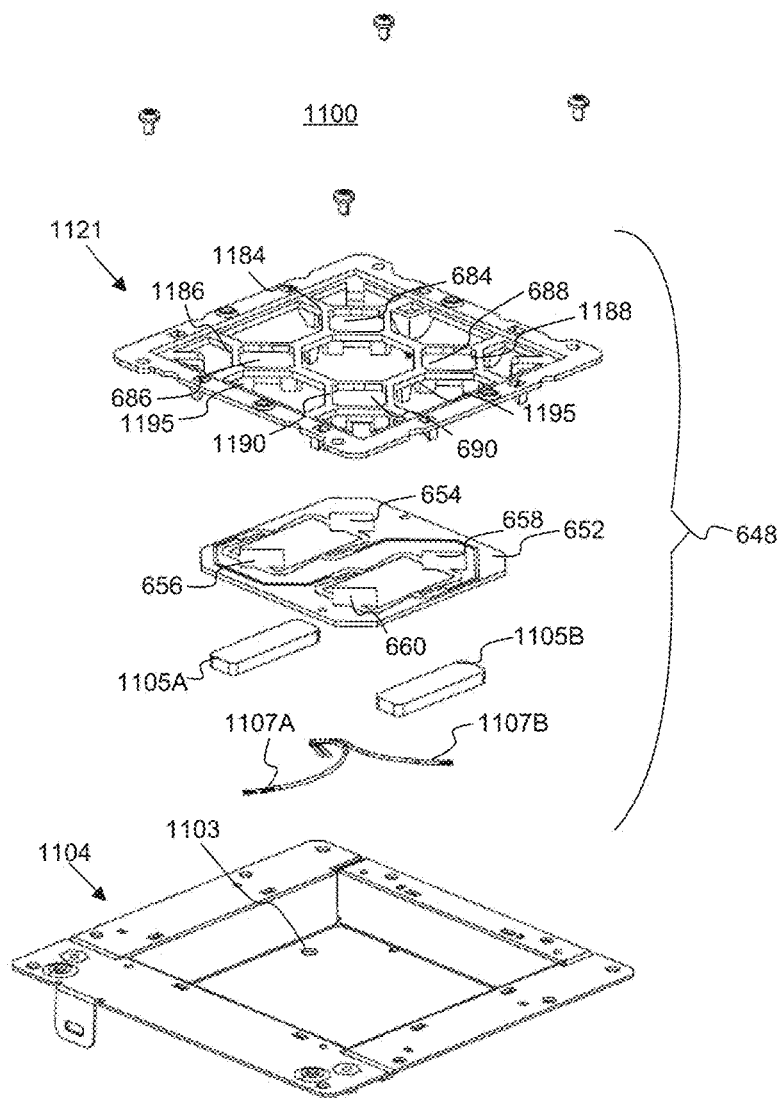
FIG. 11A illustrates an exploded view of a top (or bottom) antenna assembly, according to one embodiment.

FIG. 11A is an exploded view of a bottom antenna assembly 1100 (which may also represent a top antenna assembly), according to one embodiment. The bottom antenna assembly 1100 may include, but not be limited to, the phased array patch antenna 648 of FIG. 6B disposed within the chamber formed by a metal section 1104. The metal section 1104 may correspond to any of the fifth metal section 512, which forms the top chamber, or the sixth metal section 514, which forms the bottom chamber, as illustrated in FIG. 5.

The phased array patch antenna 648 may further include a pair of conductive foam 1105A and 1105B, a first coax cable 1107A, a second coax cable 1107B, the PCB 652, and an antenna frame 1121. The conductive foam 1105A, 1105B may be positioned between the PCB 652 and the back wall of the metal section 1104 to help parasitically couple the patch elements disposed on the PCB 652 to ground (e.g., the metal section 1104 that is grounded) through the PCB 652. The first coax cable 1107A may connect between the first RF feed 671 and a radio on the main circuit board through an aperture 1103 of the metal section 1104. The second coax cable 1107B may connect between the second RF feed 675 and the radio also through the aperture 1103 of the metal section 1104. Although shown formed in the back wall, the aperture may be formed in any of the angled sidewalls of the metal section 1104.

The antenna frame 1121 may be made of any dielectric such as a polymer (or equivalent) material, e.g., PC/ABS or the like. The antenna frame 1121 may be attached between at least two of the sidewalls of the metal section 1104 such as to be oriented in a second plane parallel to the first plane of the PCB 652, and to retain the parasitic elements 684, 686, 688, and 690 at the predetermined distance from respective patch elements 654, 656, 658, and 660 on the PCB 622. More specifically, the antenna frame 1121 may include a number of frame elements, including a first frame element 1184 to retain the first parasitic element 684, a second frame element 1186 to retain the second parasitic element 686, a third frame element 1188 to retain the third parasitic element 688, and a fourth frame element 1190 to retain the fourth parasitic element 690 at the predetermined distance from the corresponding patch elements 654, 656, 658, and 660. Each frame element may include one or more extension tabs 1195 with a depth sized to the predetermined distance. Each frame element and extension tabs may be minimized in size to reduce the amount of polymer-based material existing between the parasitic elements and the patch elements, thus maximizing an amount of parasitic coupling between the patch elements and parasitic elements.

Figure 11B:
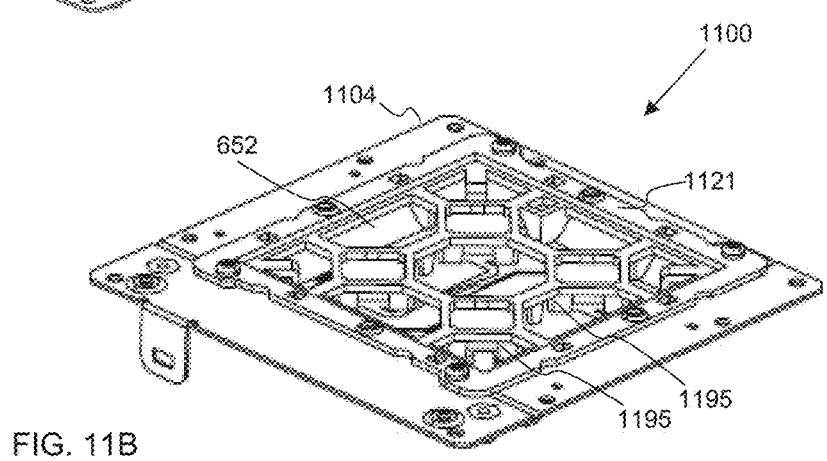
FIG. 11B illustrates a completely assembled top (or bottom) antenna assembly, according to one embodiment.

FIG. 11B illustrates a completely assembled bottom antenna assembly 1100, according to one embodiment. As illustrated, the bottom antenna assembly 1100 has now been assembled with the phased array patch antenna 648 and the antenna frame 1121 mutually aligned and attached to the back wall of the metal section 1104 in the recessed region previously mentioned. The extension tabs 1195 may abut up against the PCB 652, thus ensuring to keep the gap defining the predetermined distance constant. In this way, the reflective metal of the angled sidewalls can now reflect the radiation pattern produced by the patch elements of the phased array patch antenna 648 directionally to the outside of the metal housing 502, e.g., out the top or the bottom of the metal housing.

Figure 12:
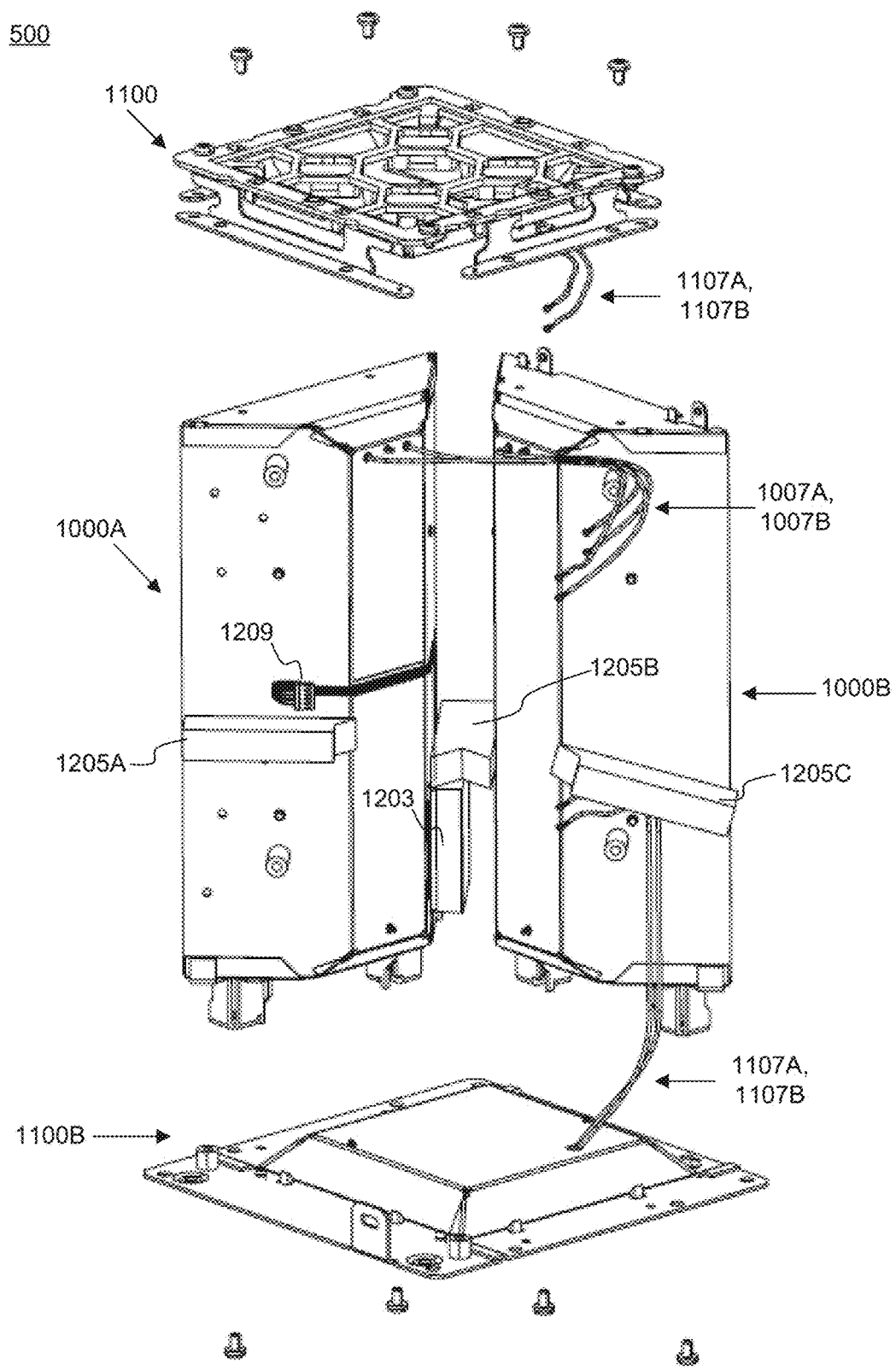
FIG. 12 illustrates a partially exploded view of the MRMC network device of FIG. 5A, including two side antenna assemblies, a top antenna assembly, and a bottom antenna assembly, according to one embodiment.

FIG. 12 illustrates a partially exploded view of the MRMC network device 500 of FIG. 5A, including two side antenna assemblies 1000A and 1000B, the top antenna assembly 1100, and a bottom antenna assembly 1100B, according to one embodiment. The top antenna assembly 1100 attaches to a top of the side antenna assemblies (four in total as illustrated in FIG. 5A) and the bottom antenna assembly 1100B attaches to the bottom of the side antenna assemblies. Note that the first coax cable 1007A and the second coax cable 1007B of each of the side antenna assemblies 1000A and 1000B are fed through the apertures 1003A and 1003B, respectively, in the back wall of each metal section 1004 of the side antenna assemblies (FIG. 10A), although the apertures 1003A and 1003B may alternatively be formed in a sidewall of each metal section 1004 in alternative embodiments. Further note that the first coax cable 1107A and the second coax cable 1107B of each of the top antenna assembly 1100 and the bottom antenna assembly 1100B are fed through the aperture 1103 in the back wall of the metal section 1104 (FIG. 11A), although the aperture 1003 may alternatively be formed in one of the angled sidewalls of the metal section 1104. These coax cables may each be coupled to a radio on the main circuit board 1402, which is first illustrated in FIG. 14.

FIG. 12 further illustrates a battery 1203 attached to a sidewall of the metal section 1004 of the side antenna assembly 1000A, a battery cable 1209 for the battery 1203, and a set of air dams, including a first air dam 1205A, a second air dam 1205B, and a third air dam 1205C. Each air dam is positioned between two side antenna assemblies to block air from back flowing into a bottom part of the metal housing 502, which will be discussed in more detail.

Figure 13A:
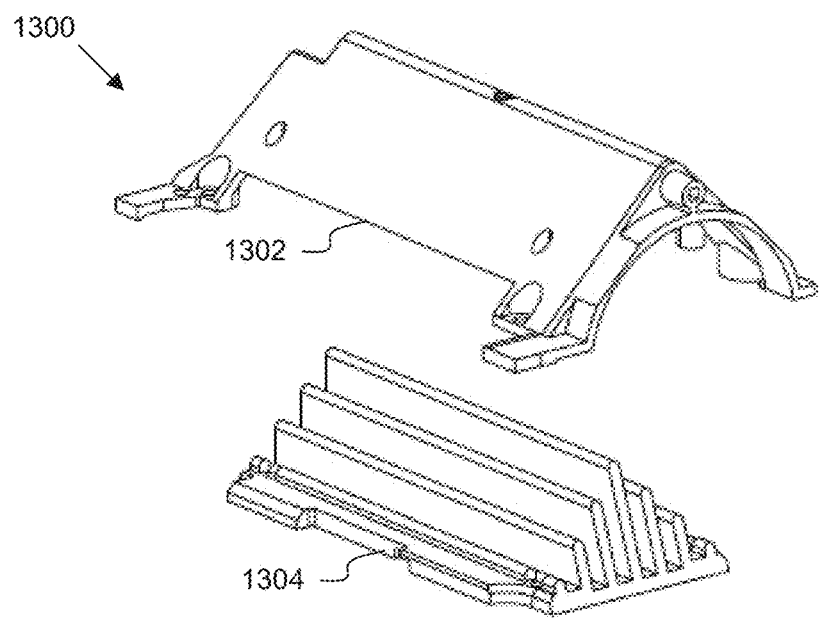
FIG. 13A illustrates a first air baffle assembly that cools a main circuit board of the MRMC device of FIG. 5A according to one embodiment.

FIG. 13A illustrates a first air baffle assembly 1300 that cools a main circuit board of the MRMC network device 500 of FIG. 5A according to one embodiment. The first air baffle assembly 1300 may include a first air baffle 1302 and a first heat sink 1304. The first heat sink 1304 is sized to fit inside of the first air baffle 1302, and the entire first air baffle assembly 1300 has a triangular cross-section adapted to fit into half of the rectangular inner chamber of the metal housing 502. In one embodiment, the first air baffle 1302 and the first heat sink 1304 is formed as a single extrusion of conductive metal, e.g., for de-sensing and additional cooling properties of the conductive metal.

Figure 13B:
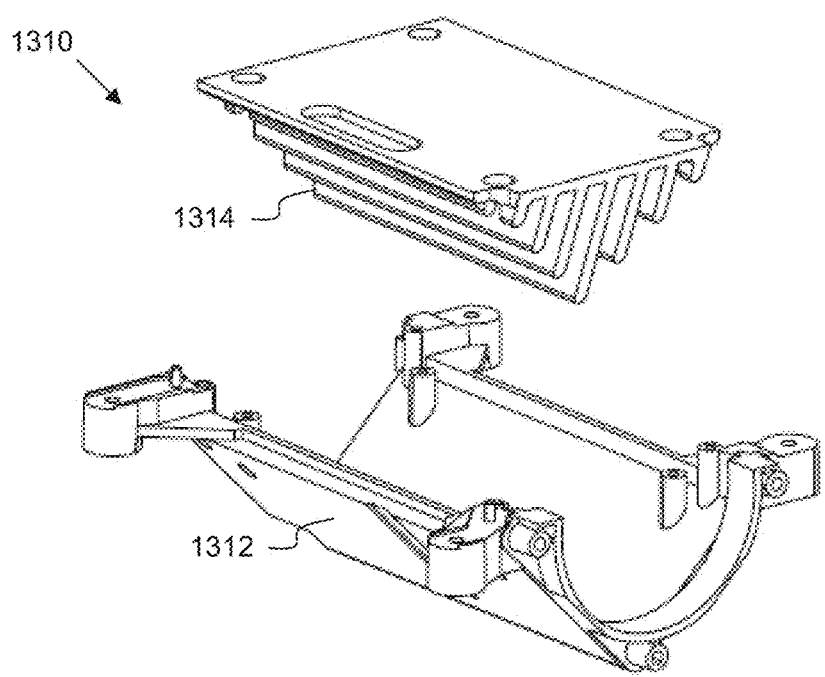
FIG. 13B illustrates a second air baffle assembly that also cools the main circuit board of the MRMC device of FIG. 5B according to one embodiment.

FIG. 13B illustrates a second air baffle assembly 1310 that also cools the main circuit board of the MRMC device 500 of FIG. 5B according to one embodiment. The second air baffle assembly 1310 may include a second air baffle 1312 and a second heat sink 1314. The second heat sink 1314 is sized to fit inside of the second air baffle 1312, and the entire second air baffle assembly 1310 has a triangular cross-section adapted to fit into the other half of the rectangular inner chamber of the metal housing 500. In one embodiment, the second air baffle 1312 and the second heat sink 1314 is formed as a single extrusion of conductive metal, e.g., for de-sensing and additional cooling properties of the conductive metal.

Both the first air baffle 1302 and the second air baffle 1312 may be made of a conductive metal material, such as aluminum or copper, or made of a polymer such as polycarbonate/acrylonitrile butadiene styrene (PC/ABS), or the like. Both the first heat sink 1304 and the second heat sink 1314 may be made of a heat conductive metal such as aluminum or the like.

Figure 14:
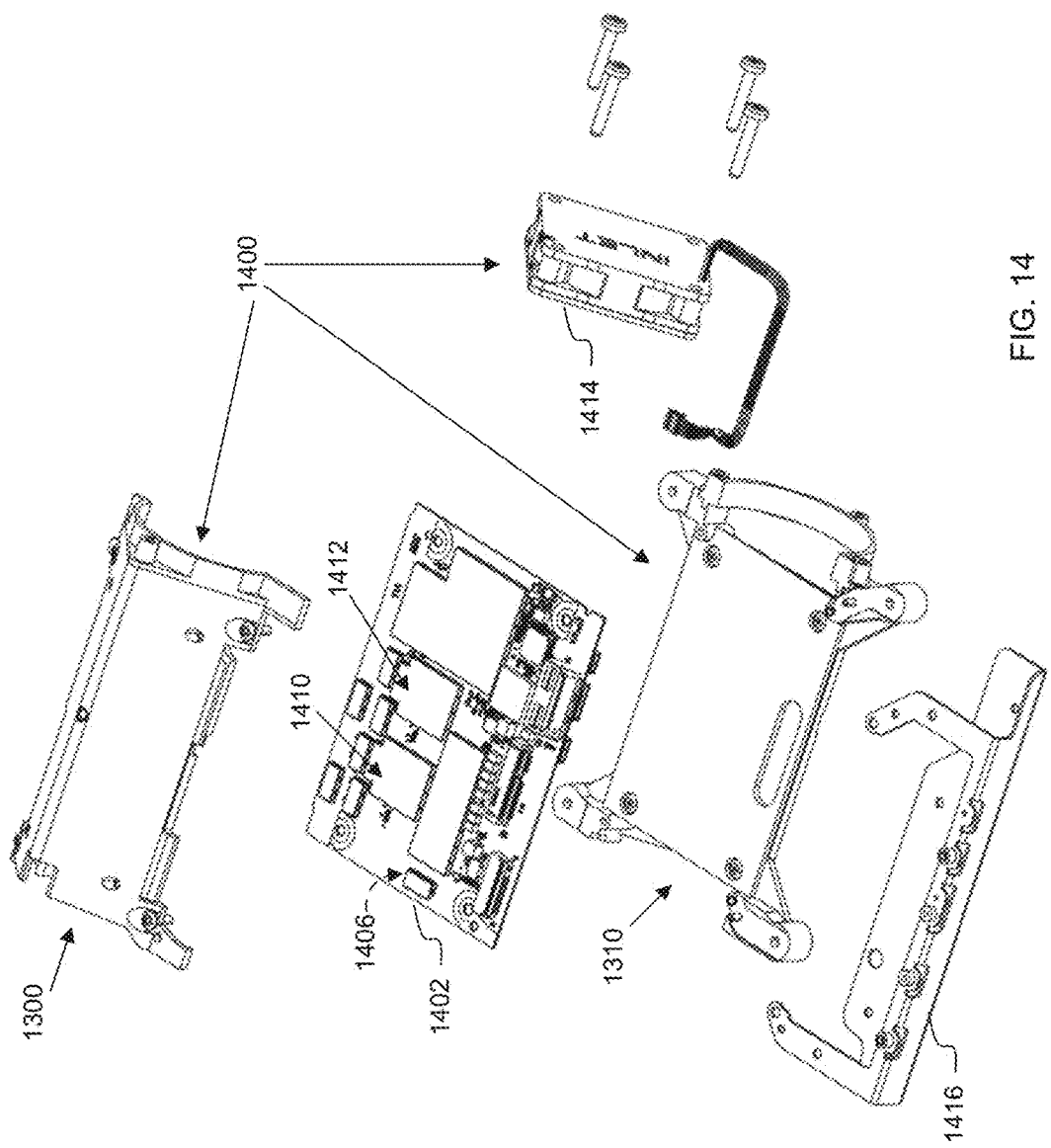
FIG. 14 illustrates an exploded view of an air cooling system, main circuit board, and support bracket according to one embodiment.

FIG. 14 illustrates an exploded view of an air cooling system 1400, main circuit board 1402, and support bracket 1416 according to one embodiment. There are at least six radios on the main circuit board 1402, including a first WLAN radio 1410, a second WLAN radio 1412 (and two more WLAN radios as well as a WiFi 2.4 GHz radio 1416 on the other side of the main circuit board 1402 that are not visible). Due to this number of power-generating radios on the main circuit board 1402, the air cooling system 1400 has a lot of cooling to perform. In various embodiments, the air cooling system 1400 may include the first air baffle assembly 1300, the second air baffle assembly 1310, and a fan 1414 adapted to attach to a first end of each of the first air baffle assembly 1300 and the second air baffle assembly 1310. The support bracket 1416 may attach to (or along) an edge of the main circuit board 1402 to provide extension space for attachment of additional components as will be discussed with reference to FIGS. 15A, 15B, and 15C. The support bracket 1416 may also be attached to the second air baffle assembly 1310.

Figure 15A:
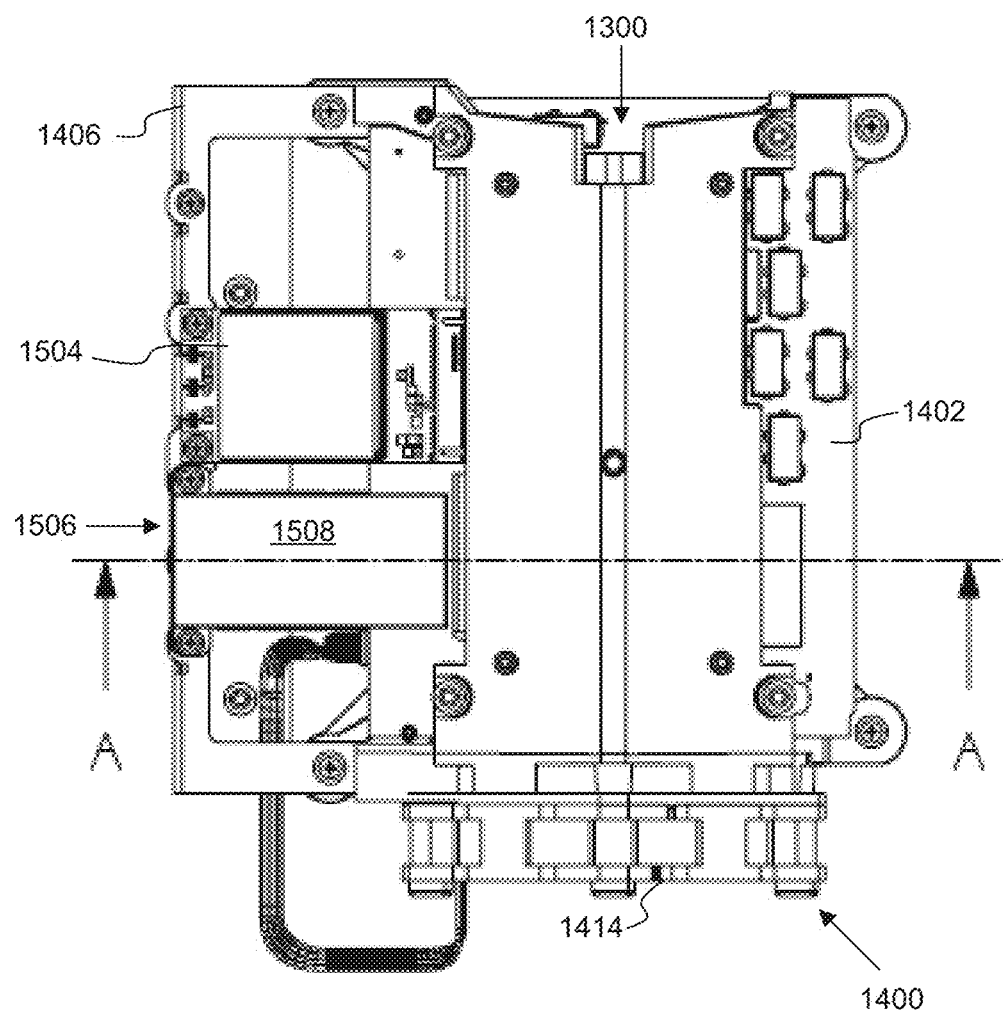
FIG. 15A illustrates a side view of the assembled air cooling system, main circuit board, and support bracket according to one embodiment.
Figure 15B:
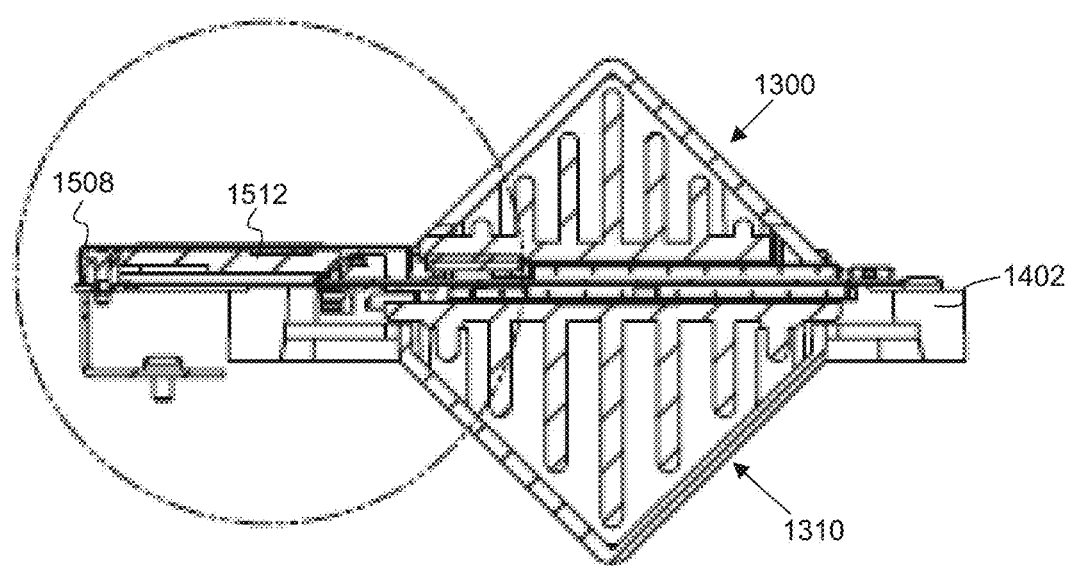
FIGS. 15B and 15C illustrate a shield cover for attaching a storage device to both the support bracket and the main circuit board according to one embodiment.
Figure 15C:
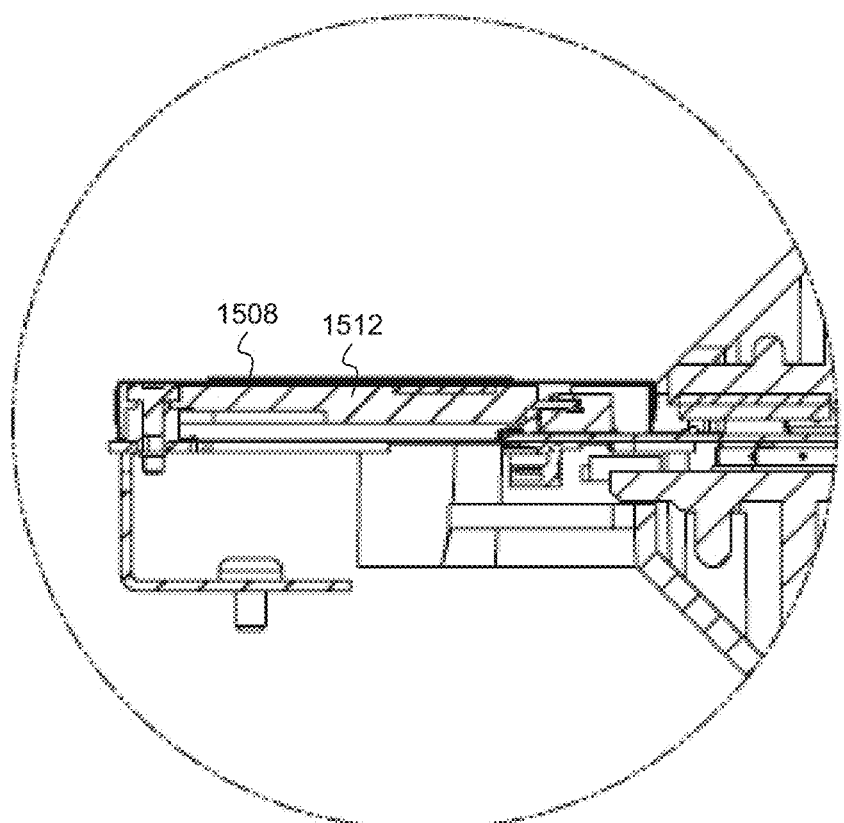

FIG. 15A illustrates a side view of the assembled air cooling system 1400, main circuit board 1402, and support bracket 1416 according to one embodiment. The MRMC network device 500 may further include a communication device 1504, e.g., that supports cellular communication via any of the cellular protocols discussed herein, and a storage card assembly 1506. The communication device 1504 may include a WWAN radio for cellular communication. With further reference to FIGS. 15B and 15C, the storage card assembly 1506 may include a shield cover 1508 and a storage device 1512. In one embodiment, the shield cover 1508 is made of metal and the storage device 1512 is a solid-state drive (SSD) card, although other types of storage devices are envisioned. FIG. 15C is a blow up of the encircled portion of the support bracket 1416 shown in FIG. 15B. The shield cover 1508 may be adapted to both completely cover (e.g., snap onto) the storage device 1512 and to securely attach the storage device 1512 to both the support bracket 1416 and to the storage device 1512. For example, the shield cover 1508 may include extension tabs that form openings through which a fastener may attach the shield cover 1508 to the support bracket 1416.

Figure 16:
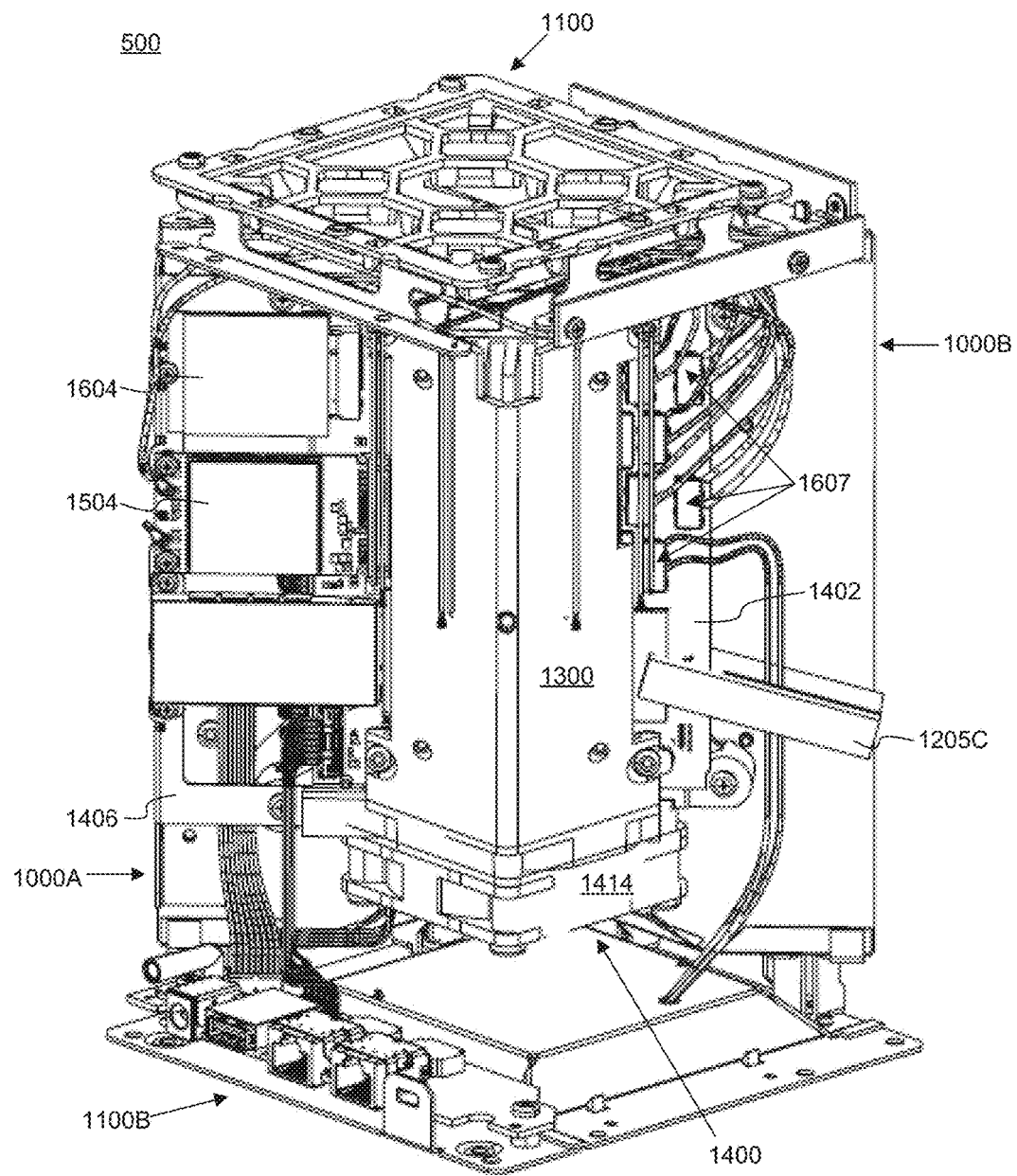
FIG. 16 illustrates a perspective view of a partially-assembled MRMC network device with placement of the assembled air cooling system, main circuit board, and support bracket (FIG. 15A), according to one embodiment.

FIG. 16 illustrates a perspective view of a partially-assembled MRMC network device 500 with placement of the assembled air cooling system 1400, the main circuit board 1402, and the support bracket 1416 (FIG. 15A), according to one embodiment. Note that the assembled air cooling system 1400, the main circuit board 1402, and the support bracket 1416 has now been positioned within the inner chamber of the metal housing 502, with the support bracket 1416 being located between two of the side antenna assemblies, e.g., side antenna assembly 1000A and another side antenna assembly that is not shown.

In various embodiments, the air cooling system 1400 includes the air dams 1205A, 1205B, 1205C, and a fourth air dam 1205D (FIG. 18), each of which are adapted and conformed to fit between respective of the four side antenna assemblies. For example, each air dam may be disposed longitudinally between one of the first air baffle assembly 1300 or the second air baffle assembly 1310 and an intersection of two sides of the metal housing 502. The air dams may be adapted to prevent air pushed across the first heat sink 1304 and the second heat sink 1314 from back flowing into a bottom portion of the metal housing 502, e.g., so that air that is being used to cool the electronics on the main circuit board 1402 and the support bracket 1416 is not recycled hot air. In one embodiment, the support bracket 1416 may also support a modem 1604 or other secondary communication device.

Note that the square nature of the fan 1414 and the square cross-section of the attached first baffle assembly 1300 and second baffle assembly 1310 allow maximization of the sizes of the first heat sink 1304 and the second heat sink 1314 within the inner chamber of the metal housing 502. Furthermore, the positioning of the fan 1414 within a center of the inner chamber of the metal housing 502 buries the noise of the fan so that the MRMC network device 500 is quieter during operation. Furthermore, positioning the fan 1414 away from other components and parts of the metal housing 502, and attaching the fan 1414 with rubber gaskets or the like, reduces noises from vibration that may otherwise arise from a fan that is attached to the main circuit board 1402 or is in contact with components that easily vibrate.

In various embodiments, the main circuit board 1402 of the MRMC network device 500 may further include a number of RF shields and coax cable retention systems 1607, which are adapted to both shield the ends of the coax cables from other RF electromagnetic energy and to retain the end of the coax cables in place, which is discussed in more detail with reference to FIGS. 17A and 17B.

Figure 17A:
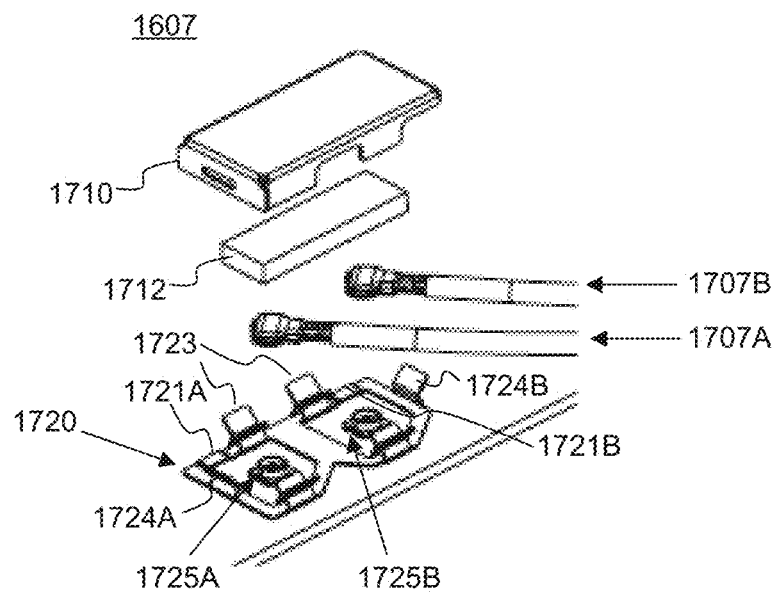
FIG. 17A illustrates an exploded view of a radio frequency (RF) shield and coax cable retention system according to one embodiment.

FIG. 17A illustrates an exploded view of an RF shield and coax cable retention system 1607 according to one embodiment. FIG. 17B illustrates an assembled view of the RF shield and coax cable retention system 17B of FIG. 17A. The RF shield and coax cable retention system 1607 may include, but not be limited to, a shield cover 1710, a foam piece 1712, a shielding fence 1720, a first coax connector 1725A, and a second coax connector 1725B, which may be assembled to provide isolation and retention for ends of a first coax cable 1707A and the second coax cable 1707B.

The shielding fence 1720, which is attached to the main circuit board 1402, may further include a pair of bridge structures 1721A and 1721B, a number of clamps 1723, and a pair of guides 1724A and 1724B. The bridges structures 1721A and 1721B may provide a path for metal lines on the main circuit board 1402 to get past the shielding fence 1720 and connect to respective of the first coax connector 1725A and the second coax connector 1725B, respectively. These metal lines may connect to a radio, for example, located elsewhere on the main circuit board 1402.

Figure 17B:
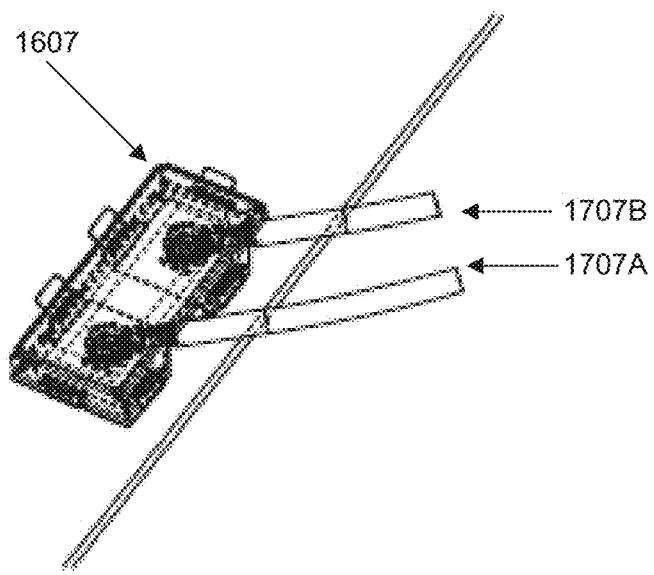
FIG. 17B illustrates an assembled view of the RF shield and coax cable retention system of FIG. 17A.

In various embodiments, the coax cables 1707A and 1707B may first be attached to respective of the first coax connector 1725A and second coax connector 1725B as illustrated in FIG. 17B. The ends of the coax cables may be oriented at a 90-degree angle with respect to the coax cables to facilitate these connections. The foam piece 1712 may fit inside of the shield cover 1710, which may be snapped into position onto the clamps 1723 located around the perimeter of the shielding fence 1720. The pair of guides 1724A and 1724B may be half clamps that guide the shield cover into position for snapping into place. The biasing of the pressure between the foam piece 1712 and the clamps 1723 provides secure retention of the coax cables 1707A and 1707B within the RF shield and coax cable retention system 1607 once attached to respective of the first coax connector 1725A and the second coax connector 1725B.

FIG. 18 illustrates an almost-complete assembly of the MRMC network device 500 according to one embodiment. Further to the discussion with reference to FIG. 16, note that a fourth side antenna assembly 1000D has been added and a third side antenna assembly 1000C is about to be added to the metal housing 502 to complete the metal housing 502 of the MRMC network device 500. While the third air dam 1205C will be located between the second and third side antenna assemblies, an additional air dam 1205D has been added to be located between the third and fourth side antenna assemblies. The air cooling system 1400 remain in place, oriented from bottom to top within the inner chamber of the metal housing 502, such that air pulled from a bottom of the inner chamber and metal housing is pushed out of the upper part of the inner chamber and the metal housing. As discussed, the air dams 1205C and 1205D provide a means by which to substantially block air back flow from the top to the bottom of the inner chamber and metal housing.

With further reference to FIG. 18, the first combination omnidirectional antenna 540 and the second combination omnidirectional antenna 545 may be attached to top sidewalls of adjacent metal sections, e.g., to the top of the third side antenna assembly 1000C and to the top of the second side antenna assembly 1000B, respectively.

Figure 19A:
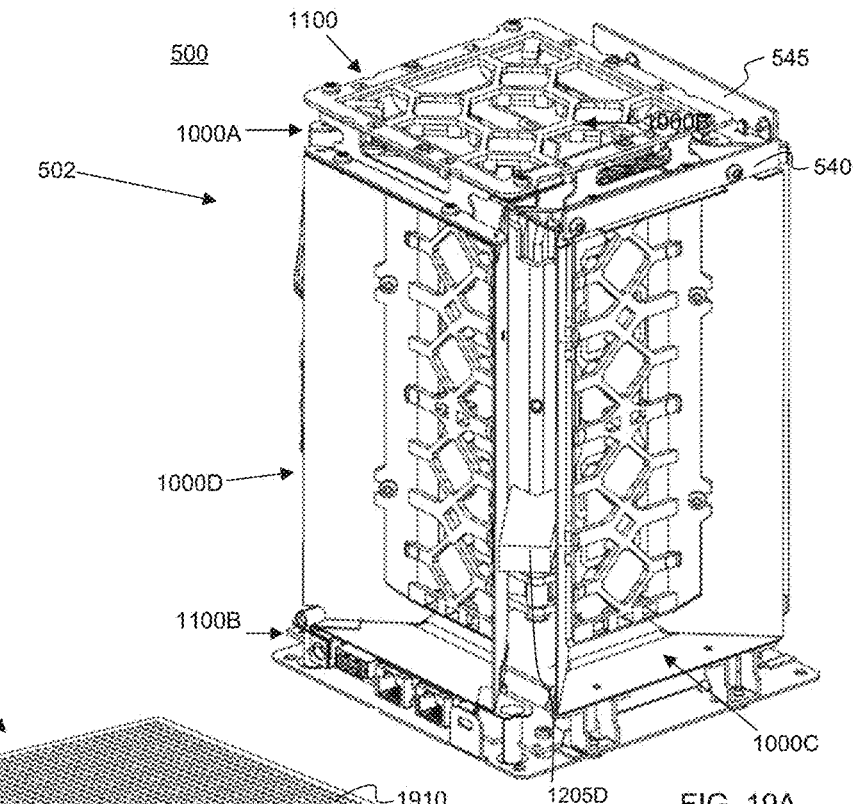
FIG. 19A illustrates a complete assembly of the MRMC network device according to one embodiment.

FIG. 19A illustrates a complete assembly of the MRMC network device 500 according to one embodiment. Further to the discussion with reference to FIG. 18, the first combination omnidirectional antenna 540 has been attached to the top of the third side antenna assembly 1000C, and the third side antenna assembly 1000C has been put in place to complete assembly of the metal housing 502 of the MRMC network device 500.

Figure 19B:
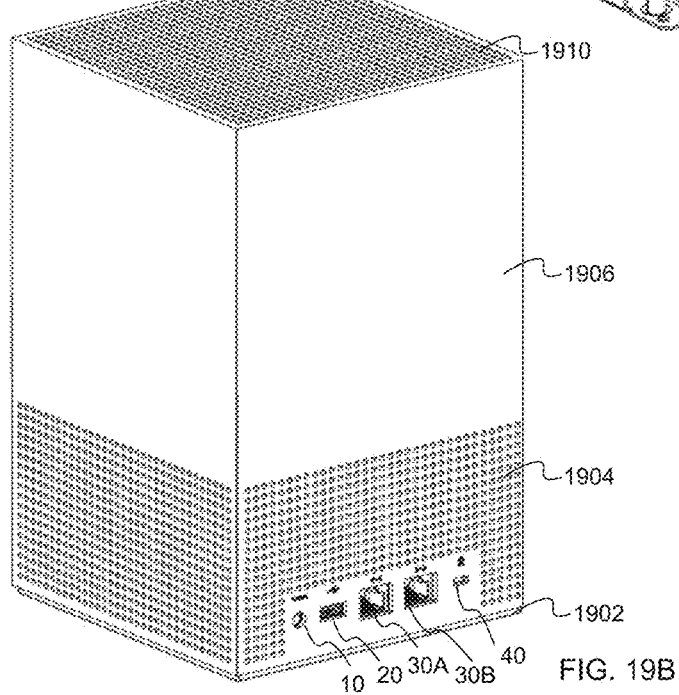
FIG. 19B illustrates the complete assembly of the MRMC network device together with a chassis placed over the outside of the metal housing of FIG. 5A, according to one embodiment.

FIG. 19B illustrates the complete assembly of the MRMC network device 500 together with a chassis 1900 placed over the outside of the metal housing 502 according to one embodiment. The chassis 1900 may include a rubber foot 1902, a first side portion 1904, a second side portion 1906, and a top portion 1910. The rubber foot 1902 may be glued or otherwise adhered to the outside of the bottom antenna assembly 1100B. The first side portion 1904 may include venting holes through which to pull air, e.g., when the fan 1414 runs to provide cooling. The second side portion 1906 may be solid and generally coincide with the area above the air dams 1205A, 1205B, 1205C, and 1205D of the air cooling system 1400, e.g., so that air that pulled through the first side portion 1904 is funneled out of the top portion 1910. Accordingly, the top portion 1910 includes exhaust holes through which to push out air exhaust after exiting the top of the inner chamber and top of the metal housing 502.

The first side portion 1904 of the chassis 1900 may further include a number of ports, including but not limited to, a light indicator 10, a Universal Serial Bus (USB) port 20, a first Ethernet port 30A, a second Ethernet port 30B, and a locking mechanism 40. The light indicator 10 may facilitate communication of troubleshooting codes to users. The locking mechanism 40 may, in one embodiment, be a Kensington® lock slot. Either of the first Ethernet port 30A or the second Ethernet port 30B may correspond to the Ethernet port 444 discussed with reference to FIG. 4.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "inducing," "parasitically inducing," "radiating," "detecting," "determining," "generating," "communicating," "receiving," "disabling," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present invention as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. An electronic device:
    a metal housing having a height greater than a width of the metal housing, the metal housing comprising four sides that form an inner chamber in a center of the metal housing;
    a first set of four sidewalls extending from a first back wall to form a first chamber located at a first of the four sides;
    a second set of four sidewalls extending from a second back wall to form a second chamber located at a second of the four sides, wherein the second chamber is different from the first chamber;
    a first antenna disposed in the first chamber;
    a second antenna disposed in the second chamber, the second antenna being electrically isolated from the first antenna by a first rectangular sidewall of each of the first and second sets of four sidewalls;
    a circuit board disposed within the inner chamber and oriented longitudinally from a bottom of the inner chamber;
    a first radio disposed on the circuit board and coupled to the first antenna through one of the four sidewalls or the first back wall of the first chamber; and
    a second radio disposed on the circuit board and coupled to the second antenna through one of the four sidewalls or the second back wall of the second chamber.

2. The electronic device of claim 1, wherein the four sidewalls that form the first chamber comprise:
    two rectangular sidewalls, to include the first rectangular sidewall, each angled from a long edge of the first back wall towards a nearest intersection of two sides of the metal housing;
    a top sidewall located between the two rectangular sidewalls and the first back wall at a top of the first chamber; and
    a bottom sidewall located between the two rectangular sidewalls and the first back wall at a bottom of the first chamber.

3. The electronic device of claim 2, wherein the first side and the second side are adjacent sides of the metal housing, wherein the electronic device further comprises:
    a first printed circuit board (PCB) on which is disposed a first antenna and a first dual-band omnidirectional antenna, the first PCB attached to the top sidewall of the first chamber, wherein the first antenna is coupled to a third radio disposed on the circuit board, the third radio to transmit and receive in a cellular frequency, and wherein the first dual-band omnidirectional antenna is coupled to a fourth radio disposed on the circuit board; and
    a second PCB on which is disposed a second antenna and a second dual-band omnidirectional antenna, the second PCB attached to a second top sidewall of the second chamber, wherein the second antenna is coupled to the third radio disposed on the circuit board, the third radio to transmit and receive in the cellular frequency, and wherein the second dual-band omnidirectional antenna is coupled to the fourth radio disposed on the circuit board.

4. The electronic device of claim 1, wherein the first antenna comprises:
    a PCB including a first antenna element having a feed coupled to the first radio, the PCB being attached to the first back wall of the first chamber; and
    an antenna frame made of a dielectric material and attached to at least two of the four sidewalls of the first chamber, wherein the antenna frame retains, within an opening of the antenna frame, a second antenna element at a predetermined distance from the first antenna element, and wherein the antenna frame further comprises one or more extension tabs with a depth sized to the predetermined distance.

5. The electronic device of claim 1, further comprising:
    a third set of four sidewalls extending from a third back wall to form a third chamber located at a third of the four sides;
    a fourth set of four sidewalls extending from a fourth back wall to form a fourth chamber located at a fourth of the four sides;
    a third antenna disposed in the third chamber;
    a first switch coupled between the third antenna and the first radio;
    a fourth antenna disposed in the fourth chamber, the fourth antenna being electrically isolated from the third antenna; and
    a second switch coupled between the fourth antenna and the second radio.

6. The electronic device of claim 5, further comprising:
four angled sidewalls extending from a fifth back wall to form a top chamber located at a top of the metal housing;
four angled sidewalls extending from a sixth back wall to form a bottom chamber located at a bottom of the metal housing;
a fifth antenna disposed in the top chamber;
a third radio disposed on the circuit board and coupled to the fifth antenna through one of the four angled sidewalls or the fifth back wall of the top chamber;
a sixth antenna disposed within the bottom chamber, the sixth antenna being electrically isolated from the fifth antenna; and
a fourth radio disposed on the circuit board and coupled to the sixth antenna through one of the four angled sidewalls or the sixth back wall of the bottom chamber.

7. The electronic device of claim 6, wherein the fifth antenna comprises:
a PCB including a first antenna element having a feed coupled to the third radio, the PCB adhered to the fifth back wall of the top chamber;
a foam layer adhered to the PCB, the foam layer being of a predetermined thickness and including raised strips formed into an open-faced box positioned on an opposite side of the foam layer from the first antenna element; and
a planar metal member disposed within the open-faced box of the foam layer.

8. The electronic device of claim 1, further comprising:
a first air baffle assembly comprising a first air baffle and a first heatsink, wherein the first air baffle and the first heatsink each has a triangular cross-section, wherein the first air baffle assembly is elongated and physically attached across a length of a first side of the circuit board;
a second air baffle assembly comprising a second air baffle and a second heatsink, wherein the second air baffle and the second heatsink each has a triangular cross-section, wherein the second air baffle assembly is elongated and physically attached across a length of a second side of the circuit board; and
a single fan attached to a first end of both the first air baffle assembly and the second air baffle assembly, and oriented to pull air from a bottom of the inner chamber and push the air out a top of the inner chamber.

9. The electronic device of claim 8, wherein the first side and the second side are adjacent sides of the metal housing, wherein the electronic device further comprises an air dam positioned in between the first chamber and the second chamber and running longitudinally between one of the first air baffle assembly or the second air baffle assembly and an intersection of two sides of the metal housing, to deter backflow of air to the bottom of the inner chamber.

10. The electronic device of claim 8, further comprising a chassis that covers the metal housing, the chassis comprising:
a first side portion located at a bottom side of the chassis, the first side portion comprising venting holes through which to pull air;
a second side portion located at a top side of the chassis, the second side portion being a solid surface; and
a top portion located at the top of the chassis, the top portion comprising exhaust holes through which to push out air exhaust after exiting the top of the inner chamber.

11. An electronic device comprising:
a metal housing, having a height greater than a width, the metal housing comprising:
a plurality of sides that form an inner chamber in a center of the metal housing;
four sidewalls extending from a first back wall that form a first chamber of a plurality of chambers, wherein each chamber of the plurality of chambers correspond to one of the plurality of sides, and wherein the four sidewalls comprise:
a first rectangular sidewall angled from a first long edge of the first back wall towards a nearest first adjacent side of the plurality of sides;
a second rectangular sidewall angled from a second long edge of the first back wall towards a nearest second adjacent side of the plurality of sides;
a top sidewall located between the first and second rectangular sidewalls and the first back wall at the top of the first chamber; and
a bottom sidewall located between the first and second rectangular sidewalls and the first back wall at the bottom of the chamber; and
a circuit board disposed within the inner chamber and oriented longitudinally from a bottom of the inner chamber;
a first antenna disposed in the first chamber of the plurality of chambers;
a second antenna disposed in a second chamber of the plurality of chambers, wherein the second antenna is electrically isolated from the first antenna;
a first radio disposed on the circuit board and coupled to the first antenna; and
a second radio disposed on the circuit board and coupled to the second antenna.

12. The electronic device of claim 11, wherein the first antenna comprises:
a printed circuit board (PCB) including a first antenna element having an antenna feed coupled to the first radio, the PCB being attached to the first back wall of the first chamber;
a conductive foam positioned between the PCB and the first back wall; and
an antenna frame made of a polymer and attached to the first and second rectangular sidewalls, wherein the antenna frame forms an opening adapted to retain a second antenna element at a predetermined distance from the first antenna element.

13. The electronic device of claim 11, further comprising:
four angled sidewalls extending from a third back wall that form a top chamber located at a top of the metal housing;
four angled sidewalls extending from a fourth back wall that form a bottom chamber located at a bottom of the metal housing;
a third antenna disposed in the top chamber;
a third radio disposed on the circuit board and coupled to the third antenna through one of the four angled sidewalls or the third back wall of the top chamber;
a fourth antenna disposed within the bottom chamber, the fourth antenna being electrically isolated from the third antenna; and
a fourth radio disposed on the circuit board and coupled to the fourth antenna through the four angled sidewalls or the fourth back wall of the bottom chamber.

14. The electronic device of claim 13, wherein the fourth antenna comprises:

a PCB including a first antenna element having a feed coupled to the fourth radio, the PCB attached to the fourth back wall of the bottom chamber;
a conductive foam positioned between the PCB and the fourth back wall; and
an antenna frame made of a polymer and attached to the four angled sidewalls, wherein the antenna frame forms an opening adapted to retain a second antenna element at a predetermined distance from the first antenna element.

15. The electronic device of claim 11, further comprising:
a support bracket attached to the circuit board to extend a width of the circuit board;
a communication device attached to both the circuit board and the support bracket;
a storage device attached to both the circuit board and the support bracket, wherein the support bracket is sized to fit at least partially between two adjacent ones of the plurality of chambers; and
a shield cover adapted to completely cover the storage device, wherein the shield cover includes tab extensions to attach the storage device to the support bracket.

16. An electronic device comprising:
an elongated metal housing having fours sides, a top, and a bottom, the elongated metal housing comprising:
   an inner chamber formed within a center of the four sides, the top, and the bottom of the elongated metal housing;
   a first metal section that forms a first chamber located on a first side of the four sides;
   a second metal section that forms a second chamber located on a second side of the four sides;
   a third metal section that forms a third chamber located on a third side of the four sides;
   a fourth metal section that forms a fourth chamber located on a fourth side of the four sides, wherein each of the first, second, third, and fourth chambers is shaped as a truncated triangular prism structure defined by a first back wall, a top sidewall, a bottom sidewall, and a pair of angled sidewalls;
   a fifth metal section that forms a top chamber located at the top of the elongated metal housing; and
   a sixth metal section that forms a bottom chamber located at a bottom of the elongated metal housing, wherein each of the top chamber and the bottom chamber is shaped as a truncated pyramid structure defined by a second back wall and four angled sidewalls;
four first antennas each of which is coupled to the first back wall of respective ones of the first, second, third, and fourth chambers;
two second antennas each of which is coupled to the second back wall of respective ones of the top chamber and the bottom chamber;
a circuit board disposed within the inner chamber and oriented longitudinally from a bottom of the inner chamber towards a top of the inner chamber; and
four radios disposed on the circuit board, wherein each of two of the four radios is coupled to one of the four first antennas through a corresponding first back wall, and each of another two radios of the four radios is coupled to one of the two second antennas through a corresponding second back wall.

17. The electronic device of claim 16, wherein each of the four first antennas comprises:
a PCB including a first antenna element having a radio feed, the PCB being elongated and coupled to the first back wall; and
an antenna frame made of a polymer and attached to the pair of angled sidewalls, wherein the antenna frame forms an opening adapted to retain a second antenna element at a predetermined distance from the first antenna element, and wherein the antenna frame includes one or more extension tabs with a depth sized to the predetermined distance.

18. The electronic device of claim 16, wherein each of the two second antennas comprises:
a PCB including a first antenna element having a radio feed, the PCB coupled to the second back wall; and
an antenna frame made of a polymer and attached to the four angled sidewalls, wherein the antenna frame forms an opening adapted to retain a second antenna element at a predetermined distance from the first antenna element, and wherein the antenna frame comprises one or more extension tabs with a depth sized to the predetermined distance.

19. The electronic device of claim 16, wherein at least one of the four first antennas comprises:
a PCB including a first antenna element having a radio feed, the PCB adhered to the first back wall;
a foam layer adhered to the PCB, the foam layer being of a predetermined thickness and including raised strips formed into an open-faced box positioned on an opposite side of the foam layer from the first antenna element; and
a planar metal member disposed within the open-faced box of the foam layer.

20. The electronic device of claim 16, further comprising:
a first air baffle assembly comprising a first air baffle and a first heatsink, wherein the first air baffle and the first heatsink each has a triangular cross-section, wherein the first air baffle assembly is elongated and physically attached across a length of a first side of the circuit board;
a second air baffle assembly comprising a second air baffle and a second heatsink, wherein the second air baffle and the second heatsink each has a triangular cross-section, wherein the second air baffle assembly is elongated and physically attached across a length of a second side of the circuit board; and
a single fan attached to a first end of both the first air baffle assembly and the second air baffle assembly, and oriented to pull air from a bottom of the inner chamber and push the air out the top of the inner chamber.

* * * * *